US011545435B2

(12) United States Patent
Kang et al.

(10) Patent No.: US 11,545,435 B2
(45) Date of Patent: Jan. 3, 2023

(54) DOUBLE SIDED EMBEDDED TRACE SUBSTRATE

(71) Applicant: QUALCOMM Incorporated, San Diego, CA (US)

(72) Inventors: Kuiwon Kang, San Diego, CA (US); Zhijie Wang, San Diego, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 48 days.

(21) Appl. No.: 16/946,104

(22) Filed: Jun. 5, 2020

(65) Prior Publication Data
US 2020/0388573 A1 Dec. 10, 2020

Related U.S. Application Data

(60) Provisional application No. 62/859,233, filed on Jun. 10, 2019.

(51) Int. Cl.
*H01L 23/538* (2006.01)
*H01L 25/065* (2006.01)
*H01L 23/498* (2006.01)

(52) U.S. Cl.
CPC .... *H01L 23/5384* (2013.01); *H01L 23/49805* (2013.01); *H01L 23/5385* (2013.01); *H01L 23/5386* (2013.01); *H01L 25/0657* (2013.01)

(58) Field of Classification Search
CPC ........... H01L 23/5384; H01L 23/49805; H01L 23/5385; H01L 23/5386; H01L 25/0657
See application file for complete search history.

(56) References Cited

U.S. PATENT DOCUMENTS

| | | | |
|---|---|---|---|
| 5,786,238 A * | 7/1998 | Pai | H05K 3/462 438/118 |
| 2007/0023387 A1 | 2/2007 | Murry | |
| 2015/0070863 A1 | 3/2015 | Yun et al. | |
| 2015/0091177 A1* | 4/2015 | Hong | H01L 24/29 257/773 |
| 2016/0086885 A1* | 3/2016 | Inagaki | H01L 23/5386 257/774 |
| 2016/0143134 A1* | 5/2016 | Tomikawa | H05K 1/0204 174/255 |

FOREIGN PATENT DOCUMENTS

| | | |
|---|---|---|
| CN | 104008998 B | 8/2016 |
| EP | 1573799 A1 | 9/2005 |
| EP | 1962342 A1 | 8/2008 |
| WO | WO-2018101051 A1 * | 6/2018 ............. H01L 23/12 |

OTHER PUBLICATIONS

International Search Report and Written Opinion—PCT/US2020/070129—ISA/EPO—dated Sep. 29, 2020.

* cited by examiner

*Primary Examiner* — Timor Karimy
(74) *Attorney, Agent, or Firm* — Loza & Loza, LLP

(57) ABSTRACT

Some features pertain to a substrate that includes a first portion of the substrate including a first plurality of metal layers, a second portion of the substrate including a second plurality of metal layers, and a plurality of insulating layers configured to separate the first plurality of metal layers and the second plurality of metal layers. A first plurality of posts and a plurality of interconnects are coupled together such that the first plurality of posts and the plurality of interconnects couple the first portion of the substrate to the second portion of the substrate.

21 Claims, 18 Drawing Sheets

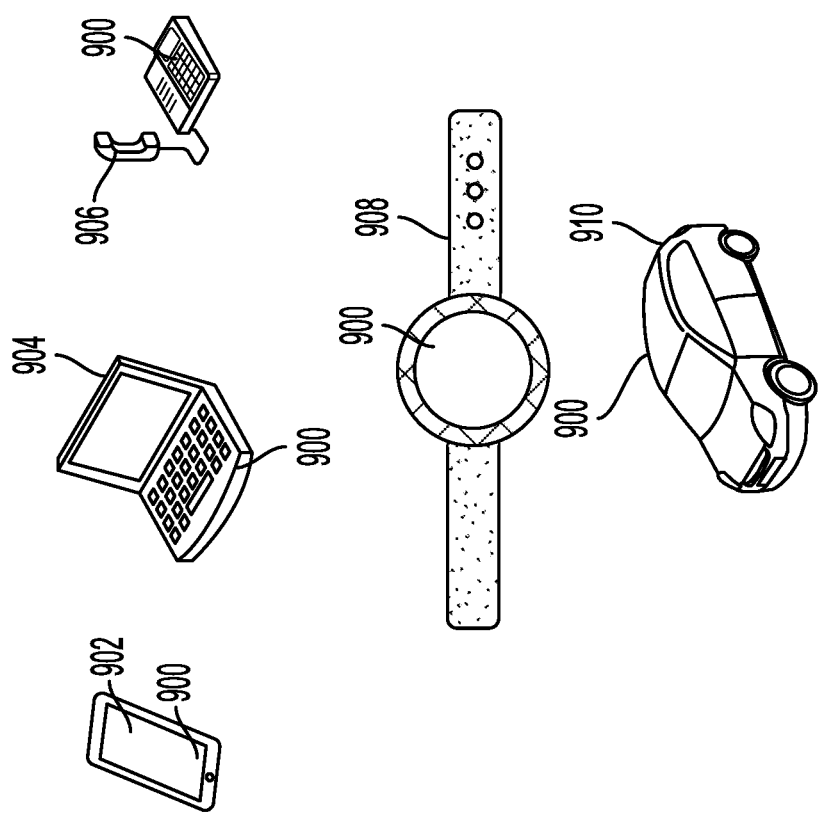

DOUBLE SIDED EMBEDDED TRACE SUBSTRATE

CLAIM OF PRIORITY UNDER 35 U.S.C. § 119

The present Application for Patent claims priority to Provisional Application No. 62/859,233 entitled "DOUBLE SIDED EMBEDDED TRACE SUBSTRATE" filed Jun. 10, 2019, and assigned to the assignee hereof and hereby expressly incorporated by reference herein.

BACKGROUND

Field of the Disclosure

Various features relate to a double sided embedded trace substrate.

Background

Integrated circuits, integrated circuit packages and electronic devices are being continually driven to smaller form factors. The connections between such devices are correspondingly being driven to have smaller width and finer pitches to increase input/output while still maintaining the smaller form factor.

Surface mount devices such as surface mounted dies are electrically coupled to electrical routing boards. The surface mounted devices are being driven to have smaller width and finer pitches and the electrical routing boards.

One way to achieve smaller width and finer pitched devices is by embedding traces in a substrate such as a package substrate.

SUMMARY

Various features relate to a double sided embedded trace substrate.

A first example provides a substrate that includes a first portion of the substrate including a first plurality of metal layers, and a second portion of the substrate including a second plurality of metal layers. The substrate includes a plurality of insulating layers configured to separate the first plurality of metal layers and the second plurality of metal layers. The substrate further includes a first plurality of posts and a plurality of interconnects coupled together such that the first plurality of posts and the plurality of interconnects couple the first portion of the substrate to the second portion of the substrate. The plurality of interconnects may be solder interconnects, or may be a second plurality of posts. The first plurality of posts are not limited to a cylindrical shape.

A second example provides a method of fabricating a substrate, including forming a first portion of the substrate including forming a first plurality of metal layers, forming a second portion of the substrate including forming a second plurality of metal layers, and forming a plurality of insulating layers configured to separate the first plurality of metal layers and the second plurality of metal layers. The method of fabricating a substrate further includes forming a first plurality of posts and a plurality of interconnects, and coupling the first plurality of posts to the plurality of interconnects such that the first portion of the substrate and the second portion of the substrate are coupled together.

DRAWINGS

Various features, nature and advantages may become apparent from the detailed description set forth below when taken in conjunction with the drawings in which like reference characters identify correspondingly throughout.

Figure 2:
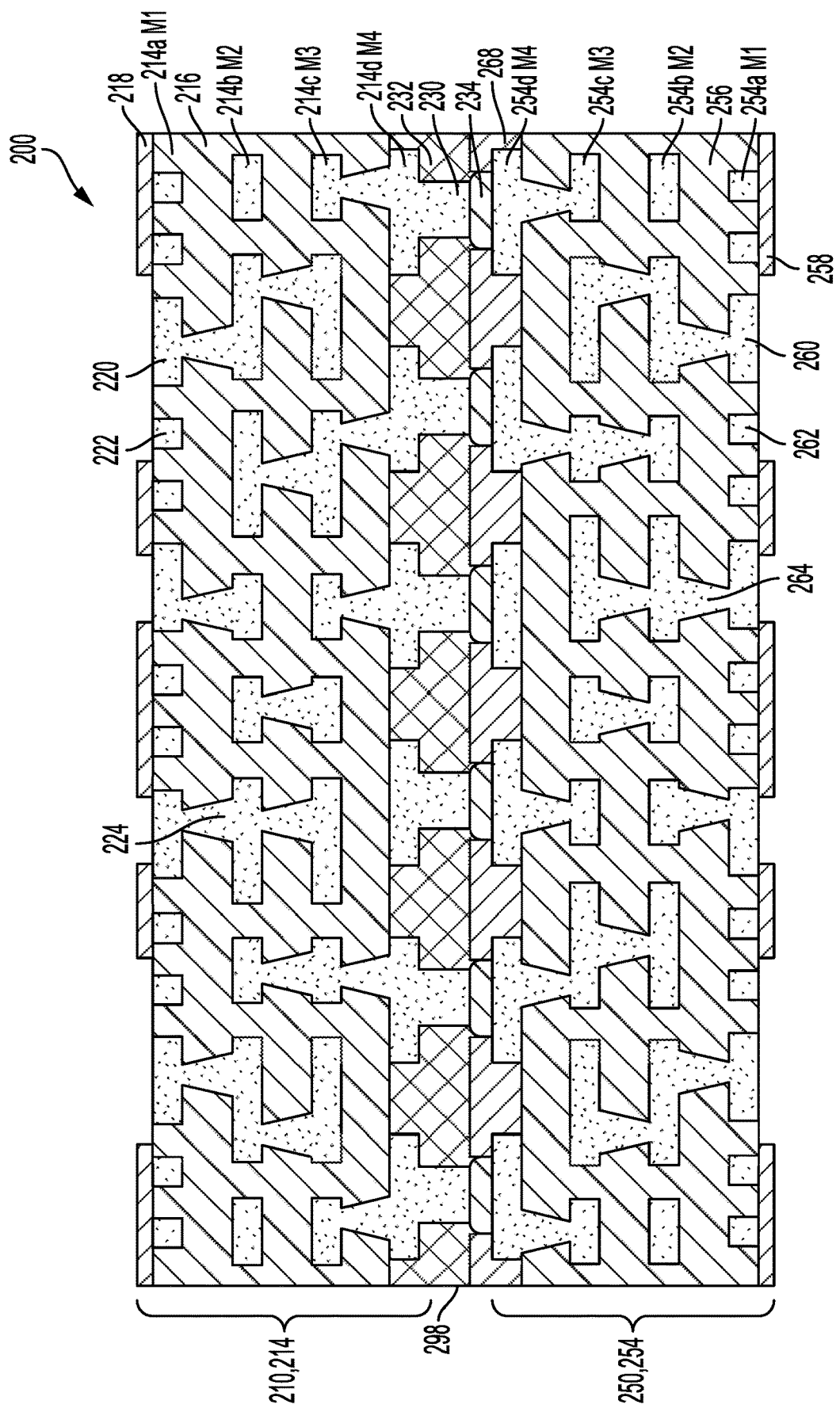
FIG. 2 illustrates a cross-section of an exemplary double sided embedded trace substrate.

FIG. 6A-D illustrate the remaining sequence of manufacturing process steps for manufacturing a double sided embedded trace substrate, such as the double sided embedded trace substrate of FIG. 2.

Figure 3:
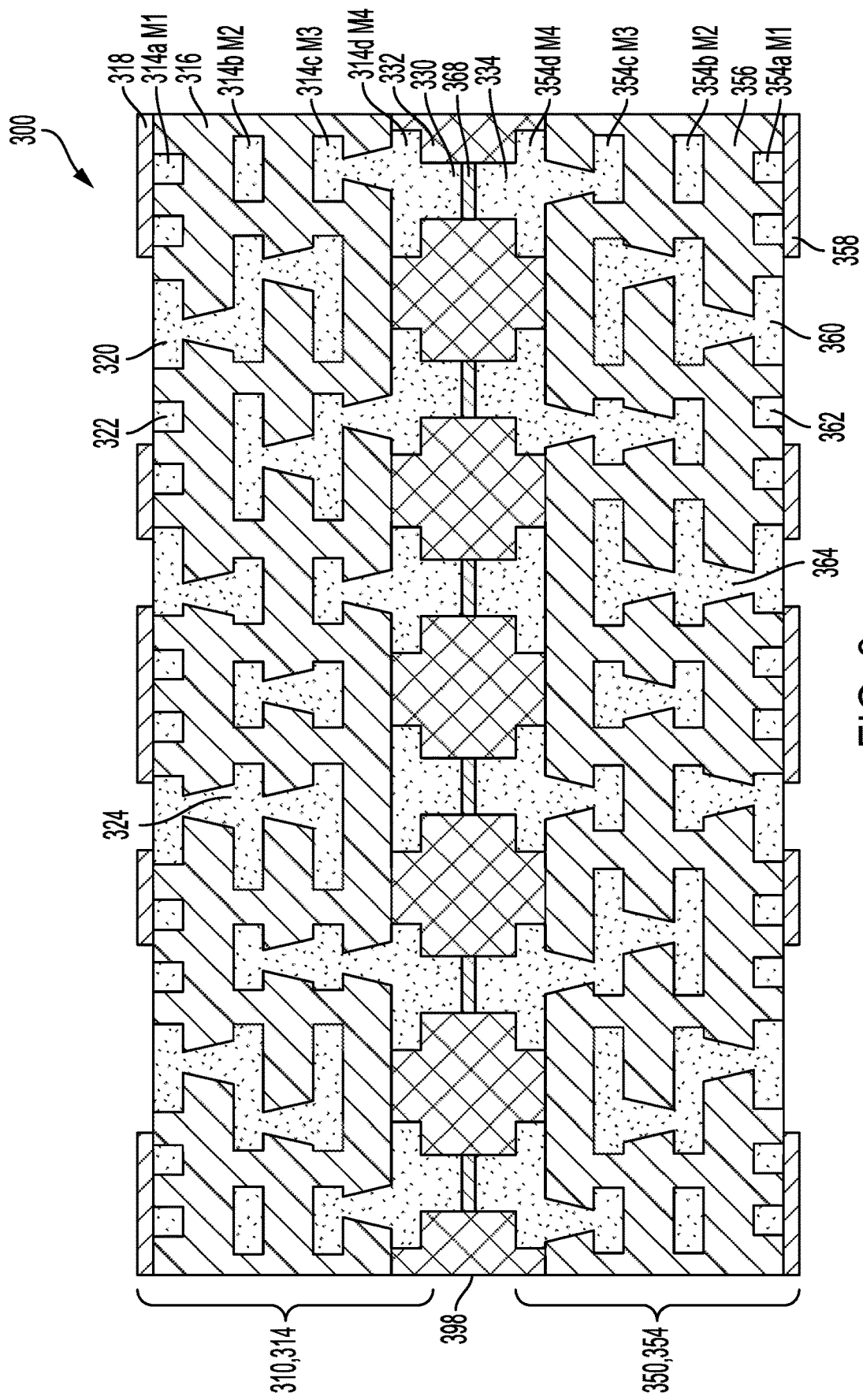
FIG. 3 illustrates a cross-section of an exemplary double sided embedded trace substrate.

FIG. 7A-7D illustrate the remaining sequence of manufacturing process steps for manufacturing a double sided embedded trace substrate, such as the double sided embedded trace substrate of FIG. 3.

Figure 8:
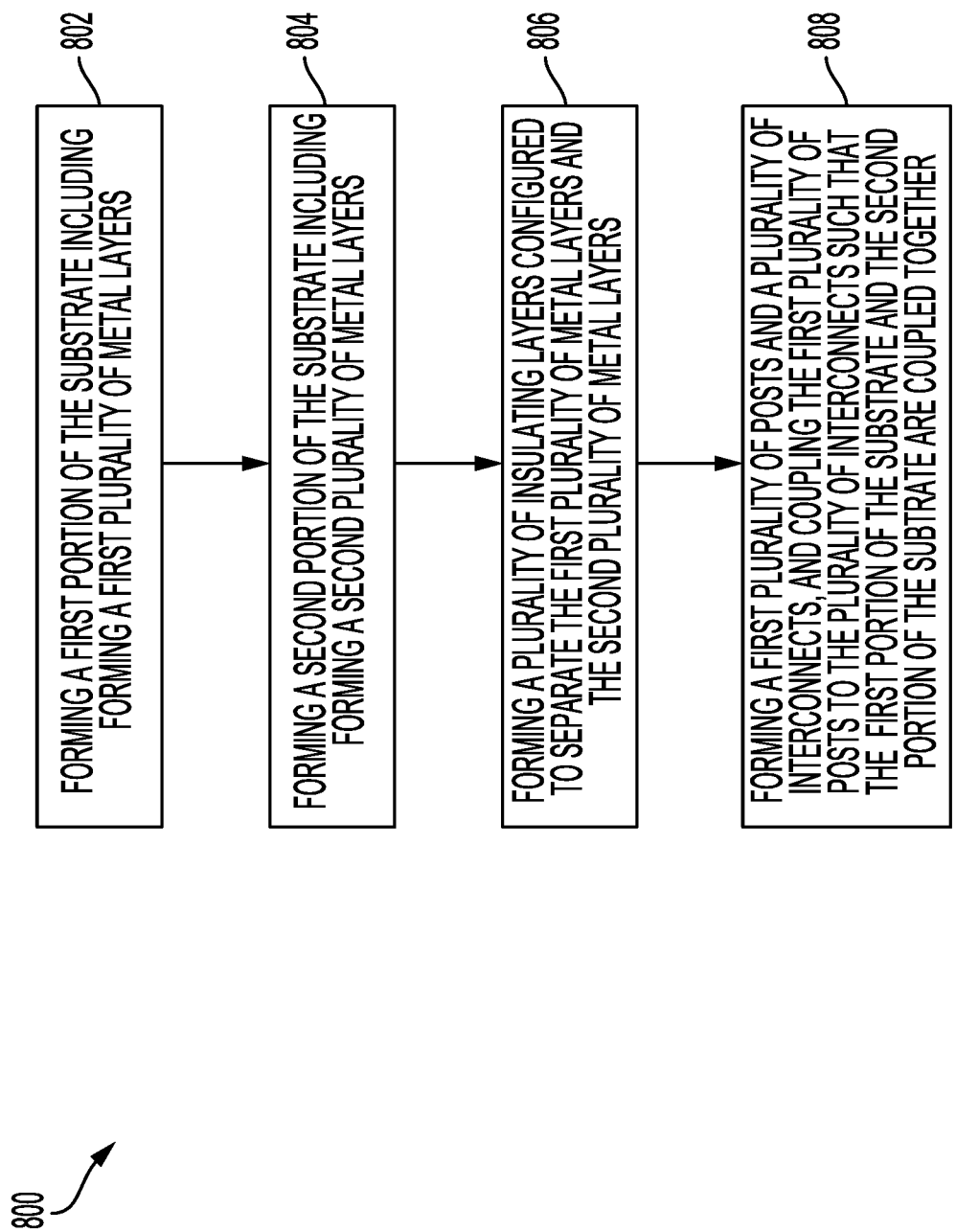

FIG. 8 illustrates an exemplary flow diagram of a method 800 for providing or fabricating a double sided embedded trace substrate.

FIG. 9 illustrates various electronic devices that may include the various substrates, integrated devices, integrated device packages, semiconductor devices, dies, integrated circuits, and/or packages described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams to avoid obscuring the aspects in unnecessary detail. In other instances, well-known circuits, structures and techniques may not be shown in detail in order not to obscure the aspects of the disclosure.

Overview

Some features pertain to a double sided embedded trace substrate. The double sided embedded trace substrate includes a first portion having a first plurality of metal layers, and a second portion having a second plurality of metal layers. A plurality of insulating layers separate and insulate each of the first plurality of metal layers and the second plurality of metal layers. A first plurality of posts and a plurality of interconnects are coupled together such that the first plurality of posts and the plurality of interconnects couple the first portion of the substrate to the second portion of the substrate.

The double sided embedded trace substrate achieves allows a surface mount circuit component to be coupled conductively directly to the embedded trace substrate, without packaging the surface mount circuit component separately. Therefore, the double sided embedded trace substrate saves the cost of separate packaging. For example, the double sided embedded trace substrate saves the cost of a package substrate for packaging the surface mount circuit. Furthermore, the double sided embedded trace substrate has a reduced overall height. The overall height is reduced by omitting the package substrate.

The double sided embedded trace substrate is comprised of a first portion and a second portion. The first portion includes embedded traces in a top metal layer and the second portion includes embedded traces in a bottom metal layer.

The first portion includes a plurality of metal layers, a plurality of pads, a plurality of embedded traces (in the top metal layer), and a plurality of vias to electrically couple the plurality of metal layers. The second portion also includes a plurality of metal layers, a plurality of pads, a plurality of embedded traces (in the top metal layer), and a plurality of vias to electrically couple the plurality of metal layers.

The first portion and the second portion of the substrate are coupled together (e.g., conductively coupled) by a first plurality of posts and a plurality of interconnects.

In a first example, the plurality of interconnects are a plurality of solder interconnects. The plurality of solder interconnects are at least partially surrounded by photoresist. The plurality of solder interconnects is reflowed so that the first plurality of posts and a the plurality of interconnects (e.g., plurality of solder interconnects) are electrically and physically coupled. Gaps between the first portion and the second portion of the substrate are filled with mold.

In a second example, the plurality of interconnects are a second plurality of posts. The first plurality of posts and the second plurality of posts are electrically and physically coupled together by a conductive film. Gaps between the first portion and the second portion of the substrate are filled with mold.

Terms and Definitions

In some implementations, an interconnect is an element or component that allows or facilitates an electrical connection between two points, elements and/or components. In some implementations, an interconnect may include a trace, a via, a pad, a pillar, a redistribution metal layer, an under bump metallization (UBM) layer, solder (e.g., solder balls). In some implementations, an interconnect is an electrically conductive material that may be configured to provide an electrical path for a signal (e.g., data signal, ground signal, power signal). An interconnect may be part of a device, electronic component, substrate, interposer, printed circuit board (PCB), die, die interconnect, or circuit. In some implementations, an interconnect may include more than one element or component.

A trace is a form of an interconnect that provides an electrical path along a horizontal or near horizontal direction in a device. In some implementations, a trace may be formed in a substrate or may be formed on the substrate. In some implementations, a trace that is formed in the substrate is an embedded trace. An embedded trace includes the case where at least two sides of the trace are covered by an insulating material of the substrate, such as a dielectric or a prepreg lamination, and a top side of the trace is not covered by the insulating material of the substrate. However, a trace need not be an embedded trace, e.g., a trace may be formed on or over the substrate. A trace may traverse the insulating material.

A via is a form of an interconnect that provides an electrical path along a vertical or near vertical direction in an integrated device. In some implementations, a via may be formed in a substrate (e.g., through substrate via). In some implementations, a via may be formed in an encapsulation layer (e.g., mold). In some implementations, a via may have vertical walls, or may have tapered or sloped walls or other orientations.

A pad is a form of an interconnect that provides an electrical path in an integrated device. In some implementations, a pad is an element or component that provides a coupling interface for an interconnect made of a different material. For example, a pad may be configured to provide an interface for a solder (e.g., solder ball).

The term "embedded", as used throughout the present disclosure, includes the case where at least two sides of an object A are covered by object B or material B.

The term "pitch" may be defined as the distance between the mid-points of two objects respectively. For example, pitch may be the distance from the mid-point of interconnect A to the mid-point of interconnect B.

The term "width" may be defined as a lateral or horizontal measurement of an object when the object is viewed in a cross-section view. For example, the width of an interconnect (e.g., 204) is the lateral or horizontal measurement of the interconnect from a first sidewall (or first side) to its second sidewall (or second side).

The term "thickness" may be defined as a vertical measurement of an object. In other words, thickness may be defined as the measurement from the bottom to the top of an object.

Unless stated otherwise, the term coupled means conductively coupled. Furthermore, an object or component or device A may be coupled to device C even though there are one or more intermediary components in between.

Plurality of Surface Mounted Packaged Integrated Circuits

Figure 1:
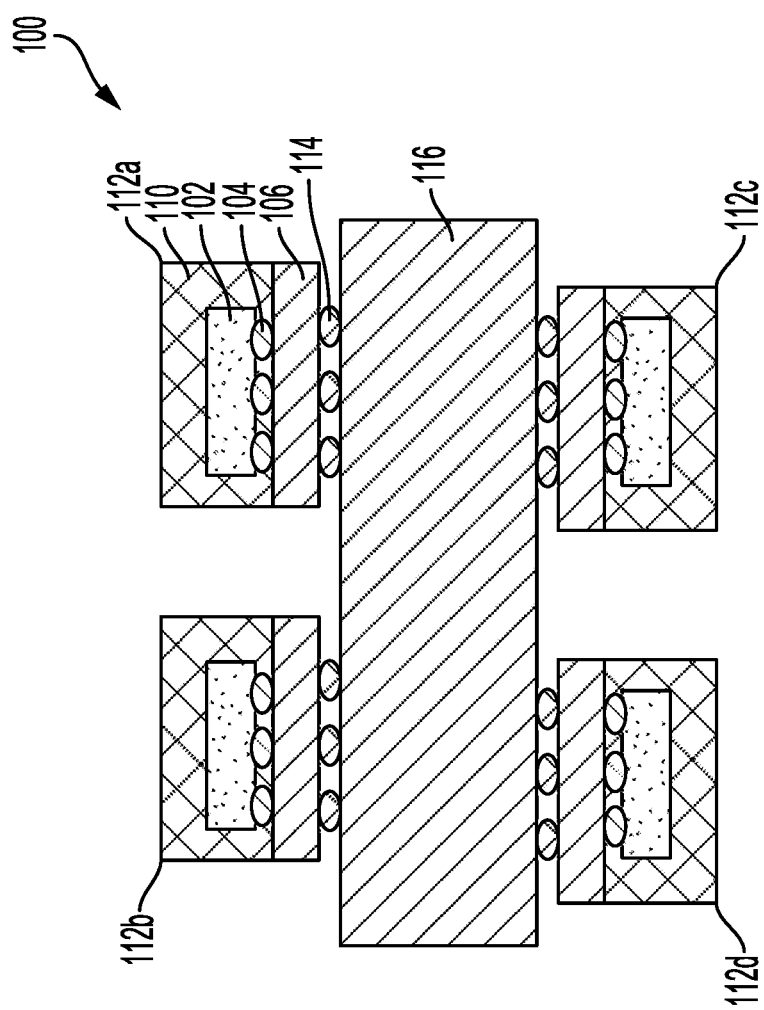
FIG. 1 illustrates a plurality of surface mounted packaged integrated circuits.

FIG. 1 illustrates a plurality of surface mounted packaged integrated circuits (ICs) 100. Specifically, FIG. 1 illustrates a plurality of surface mounted packaged ICs 112a-d, including a first packaged IC 112a, a second packaged IC 112b, a third packaged IC 112c, and a fourth packaged IC 112d. The first packaged IC 112a includes an IC (e.g., a die) 102, IC interconnects 104, a package substrate 106, a mold 110, and package interconnects 114. FIG. 1 further illustrates a printed circuit board (PCB) 116. The plurality of surface mounted packaged ICs 112a-d are surface mounted (i.e., mounted to a surface) to the PCB 116.

The IC 102 includes various interconnects (not shown) with smaller width and finer pitches relative to other technologies. The package substrate 106 includes a first side that faces the IC 102, and a second side that faces the PCB 116. A plurality of embedded traces (not shown) are located within the package substrate 106 and on the first side of the package substrate 106. Through the plurality of embedded traces (not shown), the package substrate 106 is configured to accommodate the smaller width and finer pitches of the IC 102. The IC 102 is coupled to the IC interconnects 104, and the IC interconnects 104 are coupled to the package substrate 106.

The second side of the package substrate 106 is coupled to the PCB 116 through the package interconnects 114. The PCB 116 does not accommodate the smaller width and finer pitches of the IC 102; therefore, the ICs 102 are packaged in the package substrate 106 that utilizes embedded traces (not shown).

The plurality of surface mounted packaged integrated circuits (ICs) 200 takes up a large amount of space due to the size of both the package substrate 106 and the PCB 116. Moreover, the plurality of surface mounted packaged integrated circuits (ICs) 100 incurs both the cost of both the package substrate 106 and the PCB 116.

Exemplary Double Sided Embedded Trace Substrate

FIG. 2 illustrates a cross-section of an exemplary double sided embedded trace substrate 200 (substrate 200). Specifically, FIG. 2 illustrates a first portion 210 of the substrate 200 and a second portion 250 of the substrate 200. The first portion 210 of the substrate 200 and the second portion 250 of the substrate 200 are coupled together. The first portion 210 of the substrate 200 is an embedded trace substrate and the second portion 250 of the substrate 200 is an embedded trace substrate. Together, the first portion 210 and the second portion 250 of the substrate 200 are a single substrate 200 that is a double sided embedded trace substrate.

The substrate 200 may be a package substrate, an interposer, or an embedded trace substrate. The substrate 200 may comprise a core (not shown) or may be coreless.

The first portion 210 of the substrate 200 includes a first plurality of metal layers 214 including: a first metal layer 214a, a second metal layer 214b, a third metal layer 214c, and a fourth metal layer 214d. The first metal layer 214a is a top layer, and the fourth metal layer 214d is a bottom layer of the first portion 210 of the substrate 200. The second metal layer 214b, and the third metal layer 214c are inner layers of the substrate 200. Because the fourth metal layer 214d of the first plurality of metal layers 214 is coupled to the fourth metal layer 254d of the second plurality of metal layers (as will be discussed later), the fourth metal layer 214d and the fourth metal layer 254d are also inner metal layers of the substrate 200.

Although FIG. 2 illustrates the first portion 210 of the substrate 200 as having four metal layers (i.e., the first plurality of metal layers 214a-d), this disclosure is not so limited. The first portion 210 of the substrate 200 may have less than four metal layers or more than four metal layers.

The first portion 210 of the substrate 200 includes a plurality of insulation layers 216 configured to separate and insulate each of the first plurality of metal of metal layers 214. The plurality of insulation layers 216 may comprise one material or multiple materials. The plurality of insulation layers may be a dielectric layers, or prepreg lamination layers.

The first portion 210 of the substrate 200, specifically the first plurality of metal layers 214 includes a first plurality of pads 220, a first plurality of traces 222, and a first plurality of vias 224. The first metal layer 214a of the first plurality of metal layers 214 includes a first plurality of traces 222 embedded in the first portion 210 of the substrate 200. The first plurality of traces 222 embedded in the first portion 210 of the substrate 200 are on the top of the substrate 200 (i.e., in the first metal layer 214a) and configured so that a surface mount circuit component (e.g., a die, an IC, a passive) can be coupled to the first portion 210 of the substrate 200. The first plurality of traces 222 that are embedded in the substrate 200 allow for smaller width and finer pitches, relative to traces that are not embedded.

The first plurality of pads 220 are configured to receive an interconnect such as IC interconnects 104 (of FIG. 1). The interconnect such as IC interconnects 104 are coupled to a surface mount circuit component (e.g., a die, an IC, or a passive). Photoresist 218 is placed over at least some of the first plurality of traces 222 so that when the interconnects (e.g., IC interconnect 104 of FIG. 1) are formed, the interconnects are not electrically shorted to any of the first plurality of traces 222.

The first plurality of pads 220 are coupled to the first plurality of vias 224 that vertically traverse the substrate 200. The first plurality of vias 224 allow the surface mount circuit component (not shown) to be electrically (or conductively) coupled to any of the metal layers of the first plurality of metal layers 214 or to the second portion of the substrate 200 (i.e., to any of the metal layers of the second plurality of metal layers 254).

FIG. 2 further illustrates the second portion 250 of the substrate 200 that includes a second plurality of metal layers 254 including: a first metal layer 254a, a second metal layer 254b, a third metal layer 254c, and a fourth metal layer 254d. The first metal layer 254a is a bottom layer, and the fourth metal layer 254d is a top layer of the second portion 250 of the substrate 200. The second metal layer 254b and the third metal layer 254c are inner metal layers. Because the fourth metal layer 254d of the second plurality of metal layers is coupled to the fourth metal layer 214d of the first plurality of metal layers 214, the fourth metal layer 214d and the fourth metal layer 254d are also inner metal layers of the substrate 200.

Although FIG. 2 illustrates the second portion 250 of the substrate 200 as having four metal layers (i.e., plurality of metal layers 254a-d), this disclosure is not so limited. The second portion 250 of the substrate 200 may have less than four metal layers or more than four metal layers.

The second portion 250 of the substrate 200 includes a plurality of insulation layers 256 configured to separate and insulate the second plurality of metal layers 254. The plurality of insulation layers 256 may comprise one material or multiple materials. The plurality of insulation layers 256 may be a dielectric layers, or prepreg lamination layers.

The second portion 250 of the substrate 200, specifically the second plurality of metal layers 254 includes a second plurality of pads 260, a second plurality of traces 262, and a second plurality of vias 264. The first metal layer 254a of the second plurality of metal layers 254 includes a second plurality of traces 262 embedded in the second portion 250 of the substrate 200. The second plurality of traces 262 embedded in the second portion 250 of the substrate 200 are on the bottom of the substrate 200 (i.e., in the first metal layer 254a) and configured so that another surface mount circuit component (e.g., a die, an IC, a passive) can be coupled to the second portion 250 of the substrate 200.

The second plurality of pads 260 located on the first metal layer 3541 of the second plurality of metal layers 354 are configured to receive an interconnect such as IC interconnects 104 (of FIG. 1). The interconnect such as IC interconnects 104 are coupled to another surface mount circuit component (e.g., a die, an IC, a passive). Photoresist 258 is placed over at least some of the second plurality of traces 262 so that when the interconnects (e.g., IC interconnect 104 of FIG. 1) are formed, the interconnects are not electrically shorted to any of the second plurality of traces 262.

The second plurality of pads 260 are coupled to the second plurality of vias 264 that vertically traverse the substrate 200. The second plurality of vias 264 allow the another surface mount circuit component (not shown) to be electrically (or conductively) coupled to any of the metal layers of the second plurality of metal layers 254 or to the first portion 210 of the substrate 200 (i.e., to any of the metal layers of the first plurality of metal layers 214).

The substrate 200 also includes a first plurality of posts 230 located on the fourth metal layer 214d of the first plurality of metal layers 214, where the fourth metal layer 214d is an inner portion or inner metal layer of the substrate 200. Specifically, the first plurality of posts 230 are located on the first plurality of pads 220 located on the fourth metal layer 214d. The width (i.e., the lateral or horizontal measurement when viewed in a cross-section view) of the first plurality of posts 230 is in the range 10-100 μm. The thickness (i.e., the vertical measurement when viewed in a cross-section view) of the first plurality of posts 230 is in the range of: 10~30 μm. The first plurality of posts 230 may be made of any of the following materials or combinations thereof, but are not so limited: copper, or copper with surface treatment such as Nickel-Gold or organic solderability preservative, or copper with solder. The first plurality of posts 230 may be a cylindrical shape, however, are not so limited. The first plurality of posts 230 may be rectangular or square or oval.

The substrate 200 includes a plurality of interconnects 234 located on the fourth metal layer 254d of the second plurality of metal layers 254, where the fourth metal layer 254d is an inner portion or inner metal layer of the substrate 200. Specifically, the plurality of interconnects 234 is located on another one of the first plurality of pads 220 located on the fourth metal layer 254d (of the second plurality of metal layers 254). As illustrated in FIG. 2, the plurality of interconnects 234 comprises a plurality of solder interconnects. The plurality of interconnects 234 and the fourth metal layer 214d (e.g., pads 220) are at least partially surrounded by a photoresist 268.

The first plurality of posts 230 and the plurality of interconnects 234 are coupled together such that the first plurality of posts 230 and the plurality of interconnects 234 couple the first portion 210 of the substrate 200 to the second portion 250 of the substrate 200. The first portion 210 of the substrate 210 is coupled (i.e., conductively coupled) to the second portion 250 of the substrate 200 as follows: the first plurality of posts 230 are conductively coupled to the fourth metal layer 214d, the first plurality of posts 230 are coupled (i.e., conductively coupled) to the plurality of interconnects 234. The thickness (i.e., the vertical measurement when viewed in a cross-section view) from the first metal layer 214d to the photoresist 268 is in the range of 20-60 μm.

The substrate 200 includes a gap 298 between the first portion 210 and the second portion 250 of the substrate 200. The gap 298 includes a gap between each of the first plurality of pads 220 on the fourth metal layer 254d, a gap between the lowest one of the plurality of insulation layers 216 of the first portion 210 of the substrate 200 and the photoresist 268, a gap between each one of the first plurality of posts 230 or the combination thereof.

A mold 232 is configured to fill the gap 298 between the first portion 210 and the second portion 250 of the substrate 200. The mold may be of the following material, but is not so limited: mold, non-conductive paste, non-conductive film. Furthermore, as an alternative, a dielectric or insulative material may be used instead of the mold 232. The mold 232 is also configured to fill the gap 298 located between the first plurality of pads 220 that are located on the fourth metal layer 214d of the first plurality of metal layers 214.

FIG. 3 illustrates a cross-section of an exemplary double sided embedded trace substrate 300 (substrate 300). Specifically, FIG. 3 illustrates a first portion 310 of the substrate 300 and a second portion 350 of the substrate 300. The first portion 310 of the substrate 300 and the second portion 350 of the substrate 300 are coupled together (e.g., conductively coupled and physically coupled). The first portion 310 of the substrate 300 is an embedded trace substrate and the second portion 350 of the substrate 300 is an embedded trace substrate. Together, the first portion 310 and the second portion 350 of the substrate 300 are a single substrate 300 that is a double sided embedded trace substrate.

The substrate 300 may be a package substrate, an interposer, or an embedded trace substrate. The substrate 300 may comprise a core (not shown) or may be coreless.

The first portion 310 of the substrate 300 includes a first plurality of metal layers 314 including: a first metal layer 314a, a second metal layer 314b, a third metal layer 314c, and a fourth metal layer 314d. The first metal layer 314a is a top layer, and the fourth metal layer 314d is a bottom layer of the first portion 310 of the substrate 300. The fourth metal layer 314d is also an interior layer of the substrate 200. The second metal layer 314b and the third metal layer 315b are interior layers of the first portion 310 of the substrate 200.

Although FIG. 3 illustrates the first portion 310 of the substrate 300 as having four metal layers (i.e., plurality of metal layers 314a-d), this disclosure is not so limited. The first portion 310 of the substrate 300 may have less than four metal layers or more than four metal layers.

The first portion 310 of the substrate 300 includes a plurality of insulation layers 316 configured to separate and insulate the first plurality of metal of metal layers 314. The plurality of insulation layers 316 may comprise one material or multiple materials. The plurality of insulation layers may be a dielectric layers, or prepreg lamination layers.

The first portion 310 of the substrate 300, specifically the first plurality of metal layers 314 includes a first plurality of pads 320, a first plurality of traces 322, and a first plurality of vias 324. The first metal layer 314a of the first plurality of metal layers 314 includes a first plurality of traces 322 embedded in the first portion 310 of the substrate 300. The first plurality of traces 322 embedded in the first portion 310 of the substrate 300 are on the top of the substrate 300 (e.g., an outer part of the substrate 300) (i.e., in the first metal layer 314a) and configured so that a surface mount circuit component (e.g., a die, an IC, a passive) can be coupled to the first portion 310 of the substrate 300.

The first plurality of pads 320 are configured to receive an interconnect such as IC interconnects 104 (of FIG. 1). The interconnect such as IC interconnects 104 are coupled to a surface mount circuit component (e.g., a die, an IC, a passive). Photoresist 318 is placed over at least some of the first plurality of traces 322 so that when the interconnects (e.g., IC interconnect 104 of FIG. 1) are formed, the interconnects are not electrically shorted to any of the first plurality of traces 322.

The first plurality of pads 320 are coupled to the first plurality of vias 324 that vertically traverse the substrate 300. The first plurality of vias 324 allow the surface mount circuit component (not shown) to be electrically (or conductively) coupled to any of the metal layers of the first plurality of metal layers 314 or to the second portion 350 of the substrate 300 (i.e., to any of the metal layers of the second plurality of metal layers 354).

FIG. 3 further illustrates the second portion 350 of the substrate 300 includes a first plurality of metal layers 354 including: a first metal layer 354a, a second metal layer 354b, a third metal layer 354c, and a fourth metal layer 354d. The first metal layer 354a is a bottom layer, and the fourth metal layer 354d is a top layer of the second portion 350 of the substrate 300. The second metal layer 354b and the third metal layer 354c are inner metal layers of the second portion 350 of the substrate 300.

Although FIG. 3 illustrates the second portion 350 of the substrate 300 as having four metal layers (i.e., plurality of metal layers 354a-d), this disclosure is not so limited. The second portion 350 of the substrate 300 may have less than four metal layers or more than four metal layers.

The second portion 350 of the substrate 300 includes a plurality of insulation layers 356 configured to separate and insulate the second plurality of metal layers 354. The plurality of insulation layers 356 may comprise one material or multiple materials. The plurality of insulation layers 356 may be a dielectric layers, or prepreg lamination layers.

The second portion 350 of the substrate 300, specifically the second plurality of metal layers 354 includes a second plurality of pads 360, a second plurality of traces 362, and a second plurality of vias 364. The first metal layer 354a of the second plurality of metal layers 354 includes a second plurality of traces 362 embedded in the second portion 350 of the substrate 300. The second plurality of traces 362 embedded in the second portion 350 of the substrate 300 are on the bottom of the substrate 300 (i.e., in the first metal layer 354a) and configured so that another surface mount circuit component (e.g., a die, an IC, a passive) can be coupled to the second portion 350 of the substrate 300.

The second plurality of pads 360 located on the first metal layer 354a of the second plurality of metal layers 354 are configured to receive an interconnect such as IC interconnects 104 (of FIG. 1). The interconnect such as IC interconnects 104 are coupled to another surface mount circuit component (e.g., a die, an IC, a passive). Photoresist 358 is placed over at least some of the second plurality of traces 362 so that when the interconnects (e.g., IC interconnect 104 of FIG. 1) are formed, the interconnects are not electrically shorted to any of the second plurality of traces 362.

The second plurality of pads 360 are coupled to the second plurality of vias 364 that vertically traverse the substrate 300. The second plurality of vias 364 allow the another surface mount circuit component (not shown) to be electrically (or conductively) coupled to any of the metal layers of the second plurality of metal layers 354 or to the first portion 310 of the substrate 300 (i.e., to any of the metal layers of the first plurality of metal layers 314).

The substrate 300 also includes a first plurality of posts 330 located on the fourth metal layer 314d of the first plurality of metal layers 314, where the fourth metal layer 314d is an inner portion or inner metal layer of the substrate 300. Specifically, the first plurality of posts 330 are located on the first plurality of pads 320 located on the fourth metal layer 314d. The width (i.e., the lateral or horizontal measurement when viewed in a cross-section view) of the first plurality of posts 330 is in the range of 10-100 µm. The thickness (i.e., the vertical measurement when viewed in a cross-section view) of the first plurality of posts 330 is in the range of 10-30 µm. The first plurality of posts 330 may be made of any of the following materials or combinations thereof, but are not so limited: copper, or copper with surface treatment such as Nickel-Gold or organic solderability preservative, or copper with solder. The first plurality of posts 330 may be a cylindrical shape, however, are not so limited. The first plurality of posts 330 may be rectangular or square or oval.

The substrate 300 includes a plurality of interconnects 334 located on the fourth metal layer 354d of the second plurality of metal layers 354. The fourth metal layer 354d is an inner portion or inner metal layer of the substrate 300. Specifically, the plurality of interconnects 334 are located on the second plurality of pads 320 located on the fourth metal layer 354d (of the second plurality of metal layers 354). The plurality of interconnects 334 comprise a second plurality of posts 334. The width (i.e., the lateral or horizontal measurement when viewed in a cross-section view) of the second plurality of posts 334 is in the range 10-100 µm. The thickness (i.e., the vertical measurement when viewed in a cross-section view) of the second plurality of posts 334 is in the range 10-30 µm. The second plurality of posts 334 may be a cylindrical shape, however, are not so limited. The second plurality of posts 334 may be rectangular or square or oval.

The first plurality of posts 330 and the plurality of interconnects 334 (e.g., second plurality of posts) are coupled together such that the first plurality of posts 330 and the plurality of interconnects 334 (e.g., second plurality of posts) couple the first portion 310 of the substrate 300 to the second portion 350 of the substrate 300 both conductively, and physically. The first portion of the substrate 310 is coupled (i.e., conductively coupled) to the second portion 350 of the substrate 300 as follows: the first plurality of posts 330 are conductively coupled to the plurality of interconnects 334 (e.g., the second plurality of posts). Alternatively, a conductive film 368, including an anisotropic conductive film, or a solder cap may be utilized to couple the first plurality of pillars 330 to the plurality of interconnects 334 (e.g., plurality of posts). The conductive film 368 may be used as an adhesive so that the first plurality of pillars 330 are adhered to the plurality of interconnects 334.

The substrate 300 includes a gap 398 between the first portion 310 and the second portion 350 of the substrate 300, the gap 398 can include a gap between each of the first plurality of pads 220 on the fourth metal layer 314d, a gap between each of the second plurality of pads 360 on the fourth metal layer 354d, a gap between the lowest one of the plurality of insulation layers 316 of the first portion 210 of the substrate 200 and the lowest one of the plurality of insulation layers 356 of the second portion 350 of the substrate 200, a gap between each one of the first plurality of posts 230, a gap between each one of the plurality of interconnects (e.g., the second plurality of posts) or the combination thereof.

A mold 332 is configured to fill the gap 398 between the first portion 310 and the second portion 350 of the substrate 300. The mold may be of the following material, but is not so limited: mold, non-conductive paste, or non-conductive film. Furthermore, as an alternative, a dielectric or insulative material may be used instead of the mold 332.

Figure 4:
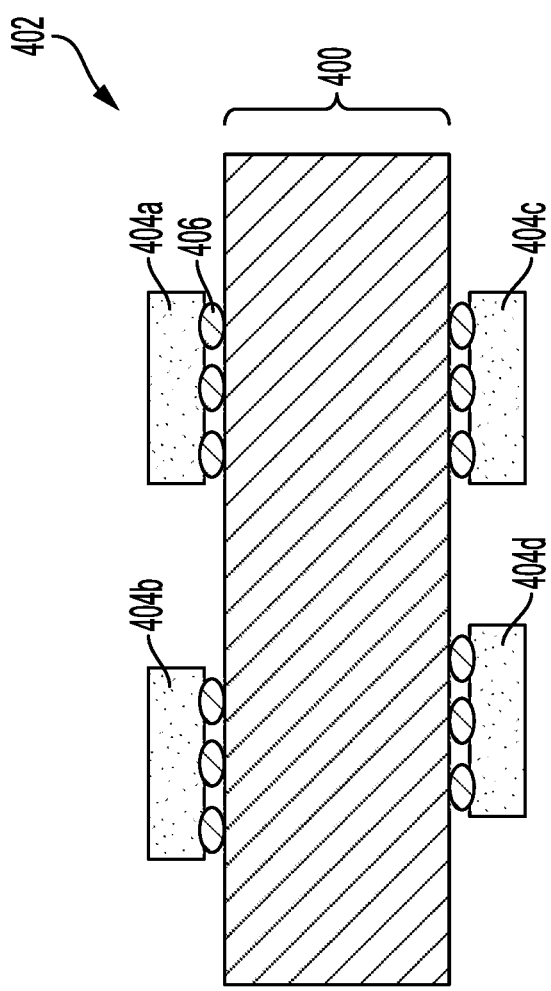
FIG. 4 illustrates a simplified view of a plurality of integrated circuits surface mounted on an exemplary double sided embedded trace substrate.

Integrated Circuits Surface Mounted on an Exemplary Double Sided Embedded Trace Substrate FIG. 4 illustrates a simplified view of a plurality of integrated circuits surface mounted on an exemplary double sided embedded trace substrate. Specifically, FIG. 4 illustrates packaged integrated circuits (ICs) 402 including a plurality of ICs 404a-d surface mounted to a double sided embedded trace substrate 400. The double sided embedded trace substrate 400 may be similar to the double sided embedded trace substrate 200 or 300 as illustrated in FIG. 2 and FIG. 3 respectively. The double sided embedded trace substrate 400 includes a first portion of the substrate 400 (not labeled), e.g., a top portion, and a second portion of the substrate 400 (not labeled), e.g., a bottom portion.

IC 404a and IC 404b are surface mounted to the first portion (e.g., top portion) of the double sided embedded trace substrate 400. IC 404c and IC 404d are surface mounted to the second portion (e.g., bottom portion) of the double sided embedded trace substrate 400. Each of the ICs 404a-d have a plurality of fine pitch interconnects 406 (not drawn to scale) configured to electrically couple each of the ICs 404a, 404b, and 404c, 404d to the double sided embedded trace substrate 400. The double sided embedded trace substrate 400 includes a first and second plurality of embedded traces (not shown) similar to those illustrated in FIGS. 2 and 3, and a first and second plurality of pads (not shown) similar to those illustrated in FIGS. 2 and 3.

The first and second plurality of traces and the first and second plurality of pads allows for the double sided embedded trace substrate 400 to have fine line and space interconnects. Because the exemplary double sided embedded trace substrate 400 has these fine line and space interconnects, the plurality of ICs 404a-d with fine pitch interconnects 406 may be directly coupled to the double sided embedded trace substrate 400. Furthermore, the plurality of ICs 404a-d do not require a separate package substrate such as package substrate 106 illustrated in FIG. 1, thereby reducing costs.

This is in contrast to the plurality of surface mounted packaged ICs 112a-d, as illustrated in FIG. 1. The plurality of surface mounted packaged ICs 112a-d have IC interconnects 104 that are fine pitched, therefore they cannot be directly coupled to the PCB 116 having wider pitched interconnects (not shown). Rather, the plurality of surface mounted packaged ICs 112a-d must be separately packaged with the package substrate 106 as illustrated in FIG. 1.

The plurality of surface mounted packaged integrated circuits (ICs) 200 takes up a large amount of space due to the size of both the package substrate 106 and the PCB 116. Moreover, because the plurality of surface mounted packaged integrated circuits (ICs) 100 incurs the cost of both the package substrate 106 and the PCB 116, it is costly. Whereas the packaged integrated circuits (ICs) 402 coupled to the exemplary double sided embedded trace substrate 400 are less costly. Furthermore, the packaged integrated ICs 402 are smaller at least in the Z direction (vertical direction), saving valuable space.

Exemplary Sequence for Manufacturing a Double Sided Embedded Trace Substrate

In some implementations, manufacturing a double sided embedded trace substrate includes several processes. FIGS. 5A-5F illustrate a sequence of manufacturing process steps that are common to both the double sided embedded trace substrate of FIG. 2 (wherein the plurality of interconnects 234 comprise a plurality of solder interconnects) and FIG. 3 (wherein the plurality of interconnects 334 comprise a second plurality of posts). The remaining sequence of manufacturing process steps to manufacture the double sided embedded trace substrate of FIG. 2 and FIG. 3 will be discussed later with respect to FIG. 6A-D and FIG. 7A-D respectively.

FIG. 5A-5F will now be described in the context of manufacturing the double sided embedded trace substrate that includes the plurality of interconnects 234 comprising a plurality of solder interconnects of FIG. 2. It should be noted that the sequence of FIG. 5A-5F may combine one or more stages to simplify and/or clarify the sequence. In some implementations, the order of the processes may be changed or modified.

Figure 5A:
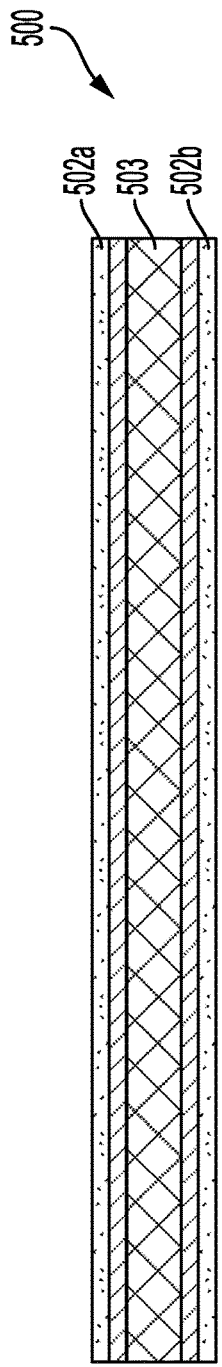
FIGS. 5A-5F illustrate a sequence of manufacturing process steps that are common to both the double sided embedded trace substrate of FIG. 2 and FIG. 3.

FIG. 5A illustrates a detachable carrier foil that is provided. The detachable carrier foil 503 may be provided by a supplier or manufactured. The detachable carrier foil has a first side (e.g., a top side) that is the basis for forming a first portion (e.g., 210) of the substrate 500. Furthermore, the detachable carrier foil 503 has a second side (e.g., a bottom side) that is the basis for forming a second portion (e.g., 550) of the substrate 500. That is, any layers formed over the first side of the detachable carrier foil is part of the first portion of the substrate, and any layers formed over the second side of the detachable carrier foil is part of the second portion of the substrate.

A seed layer 502a is formed on the first surface (e.g., a top surface) of the detachable carrier foil 503. A seed layer 502b is formed on the second surface (e.g., a bottom surface) of the detachable carrier foil 503. The seed layers 502a and 502b are used to form other metal layers on the seed layers 502a and 502b.

Figure 5B:
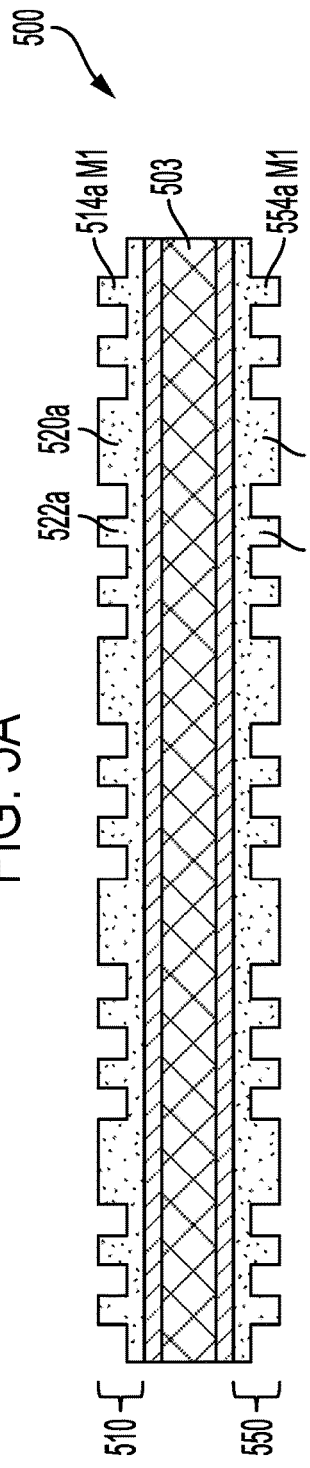

FIG. 5B illustrates a first metal layer 514a patterned or formed on the first portion 510 of the substrate 500. The first metal layer 514a includes a first plurality of pads 520a and a first plurality of traces 522a formed on the first metal layer 514a of the first portion 510 of the substrate 500.

Another first metal layer 554a is patterned or formed on the second portion 554 of the substrate 500. The first metal layer 554a includes a second plurality of pads 560a and a second plurality of traces 562b formed on the first metal layer 554a of the second portion 550 of the substrate 500.

Figure 5C:
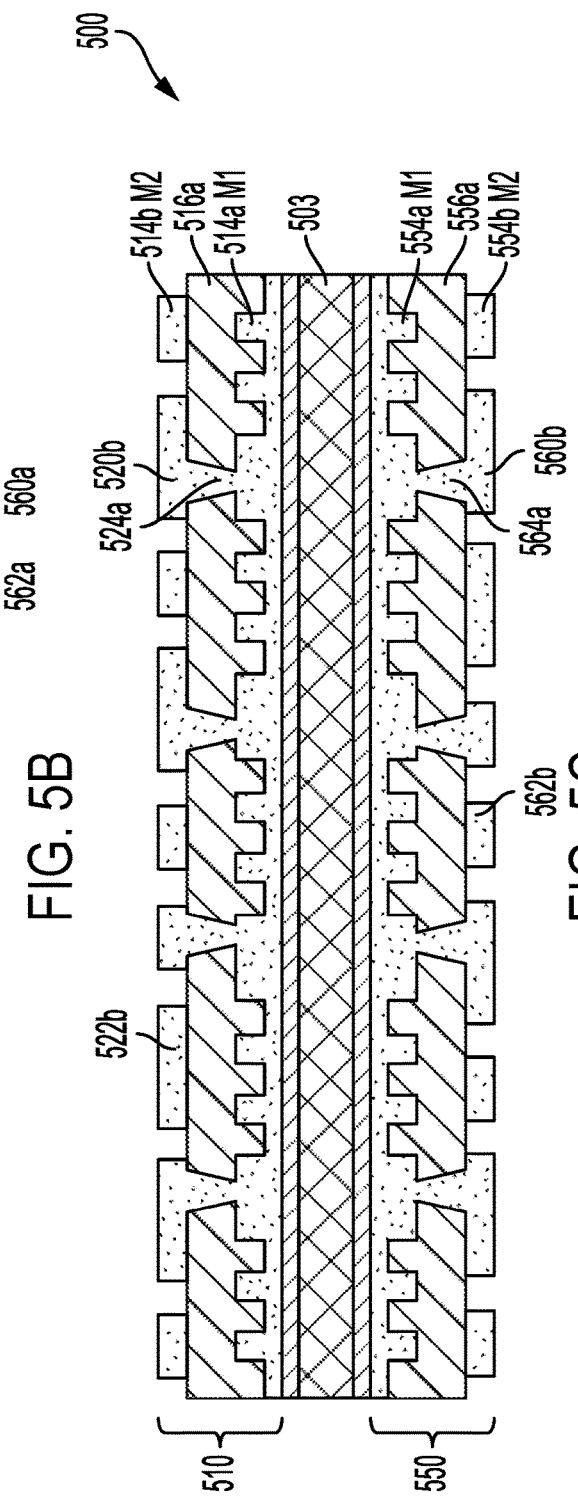

FIG. 5C illustrates an insulation layer 516a, of a first plurality of insulation layers 516, formed over the first metal layer 514a of the first portion 510 of the substrate 500. A first plurality of vias 524a are formed in the insulation layer 516a, and are configured to electrically couple the first metal layer 514a to a second metal layer 514b (of the first portion 510 of the substrate 500). The second metal layer 514b is patterned or formed on the insulation layer 516a. The second metal layer 514b comprises a first plurality of pads 520b and a first plurality of traces 522b. Some of the first plurality of pads 520b may be coupled to the first plurality of vias 524a. The first plurality of insulation layers 516 may comprise one material or multiple materials. The first plurality of insulation layers 516 may be a dielectric layers, or prepreg lamination layers FIG. 5C illustrates an insulation layer 556a over the first metal layer 554a of the second portion 550 of the substrate 500. A second plurality of vias 564a are formed in the insulation layer 556a, and are configured to electrically couple the first metal layer 554a to a second metal layer 554b (of the second portion 550 of the substrate 500). The second metal layer 554b is patterned or formed on the insulation layer 556a. The second metal layer 554b comprises a second plurality of pads 560b and a second plurality of traces 562b. Some of the second plurality of pads 560b may be coupled to the second plurality of vias 564a. The second plurality of insulation layers 556 may comprise one material or multiple materials. The second plurality of insulation layers 556 may be a dielectric layers, or prepreg lamination layers.

Figure 5D:
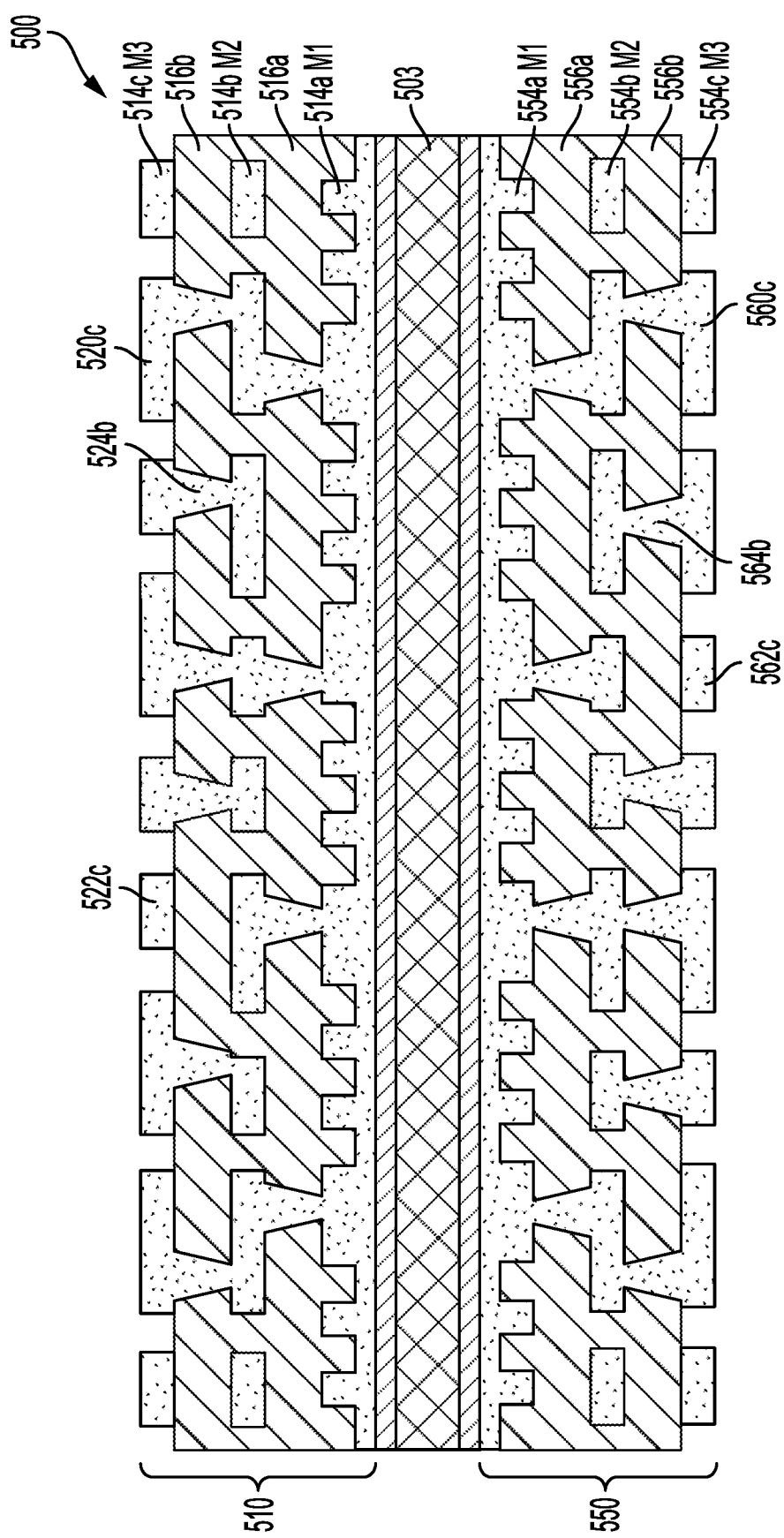

FIG. 5D illustrates an insulation layer 516b over the second metal layer 514b of the first portion 510 of the substrate 500. A first plurality of vias 524b are formed in the insulation layer 516b, and are configured to electrically couple the second metal layer 514b to a third metal layer 514c (of the first portion 510 of the substrate 500). The third metal layer 514c is patterned or formed on the insulation layer 516b. The third metal layer 514c comprises a first plurality of pads 520c and a first plurality of traces 522c. Some of the first plurality of pads 520c may be coupled to the first plurality of vias 524b.

FIG. 5D illustrates an insulation layer 556b over the second metal layer 554b of the second portion 550 of the substrate 500. A second plurality of vias 564b are formed in the insulation layer 556b, and are configured to electrically couple the second metal layer 554b to a third metal layer 554c (of the second portion 550 of the substrate 500). The third metal layer 554c is patterned or formed on the insulation layer 556b. The third metal layer 554c comprises a second plurality of pads 560c and a second plurality of traces 562c. Some of the second plurality of pads 560c may be coupled to the second plurality of vias 564b.

Figure 5E:
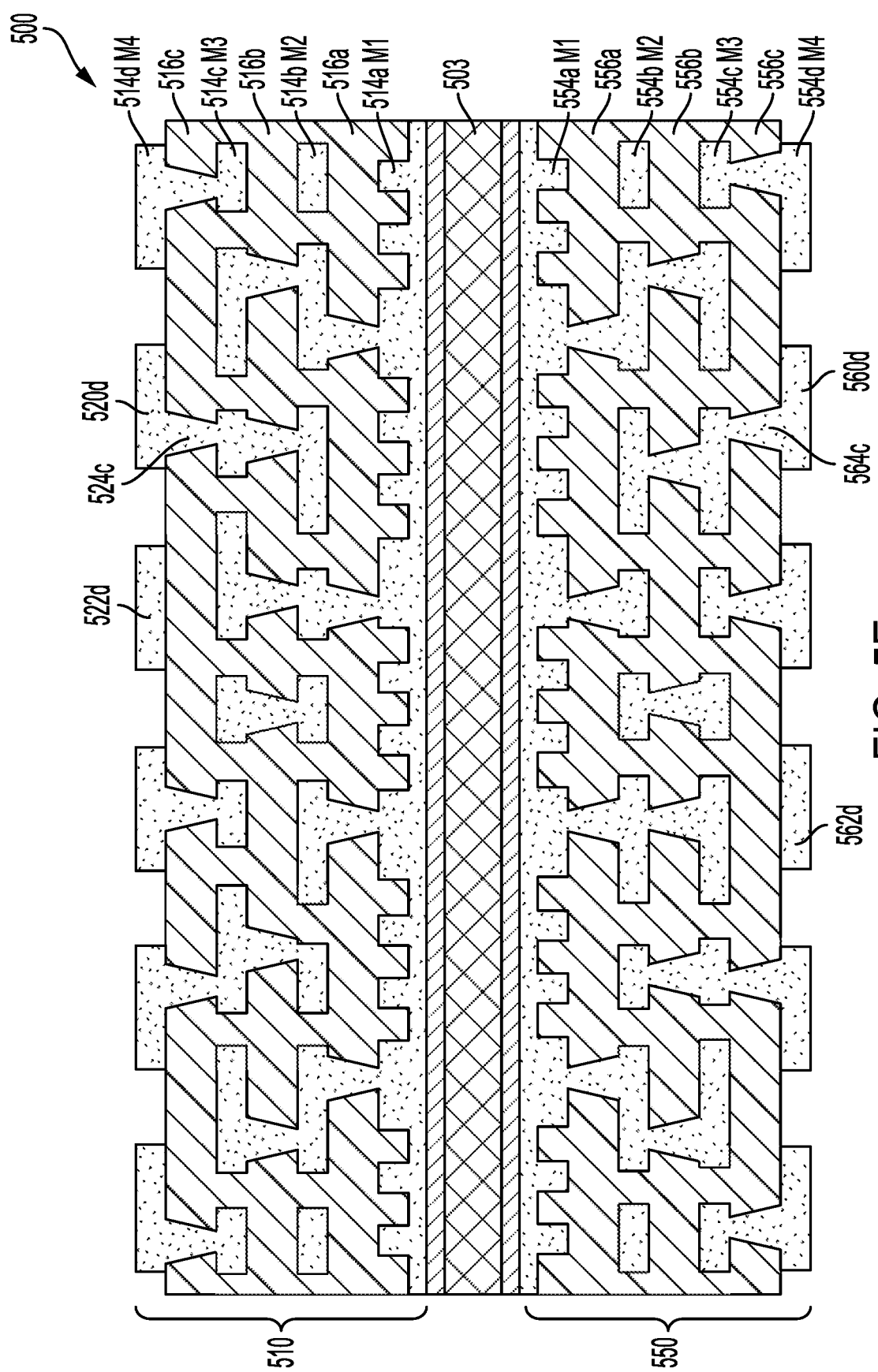

FIG. 5E illustrates an insulation layer 516c over the third metal layer 514c of the first portion 510 of the substrate 500. A first plurality of vias 524c are formed in the insulation layer 516c, and are configured to electrically couple the third metal layer 514c to a fourth metal layer 514d (of the first portion 510 of the substrate 500). The fourth metal layer 514d is patterned or formed on the insulation layer 516c. The fourth metal layer 514d comprises a first plurality of pads 520*d* and a first plurality of traces 522*d*. Some of the first plurality of pads 520*d* may be coupled to the first plurality of vias 524*c*.

FIG. 5E illustrates an insulation layer 556*c* over the third metal layer 554*c* of the second portion 550 of the substrate 500. A second plurality of vias 564*c* are formed in the insulation layer 556*c*, and are configured to electrically couple the third metal layer 554*c* to a fourth metal layer 554*d* (of the second portion 550 of the substrate 500). The fourth metal layer 554*d* is patterned or formed on the insulation layer 556*c*. The fourth metal layer 554*d* comprises a second plurality of pads 560*d* and a second plurality of traces 562*d*. Some of the second plurality of pads 560*d* may be coupled to the second plurality of vias 564*c*.

Figure 5F:
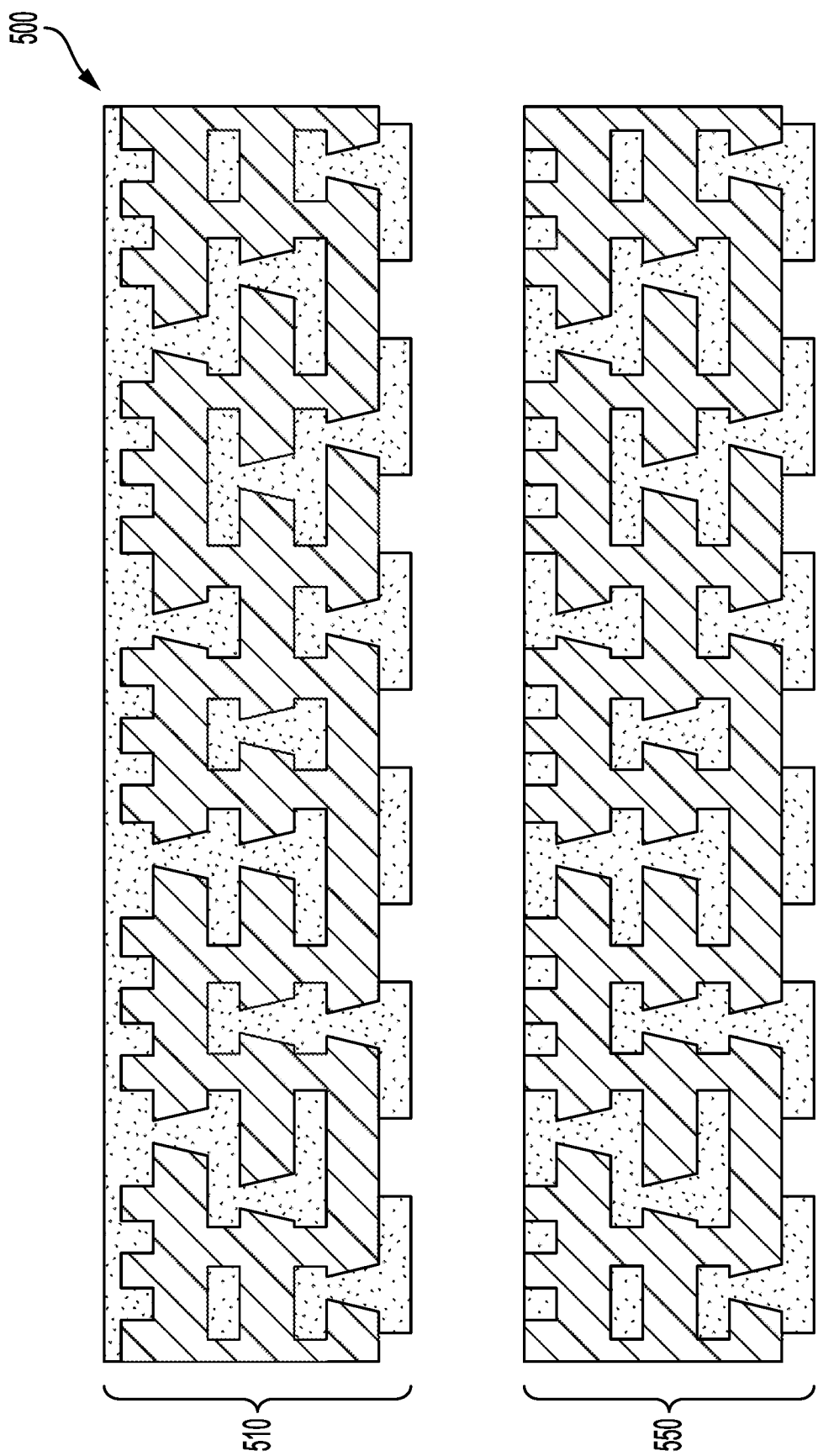

FIG. 5F illustrates the first portion 510 of the substrate 500 separated from the second portion 550 of the substrate 500 and the detachable carrier foil 503 is removed. The first portion 510 is rotated or flipped over so that the first metal layer 514*a* of the first portion 510 of the substrate 500 is facing upwards. The second portion 550 of the substrate 500 remains as illustrated.

FIG. 6A-D illustrate the remaining sequence of manufacturing process steps for manufacturing a double sided embedded trace substrate, such as the double sided embedded trace substrate of FIG. 2 (wherein the plurality of interconnects 234 comprise a plurality of solder interconnects). The remaining sequence of manufacturing process steps illustrated in FIG. 6A-D continues from FIG. 5F.

Figure 6A:
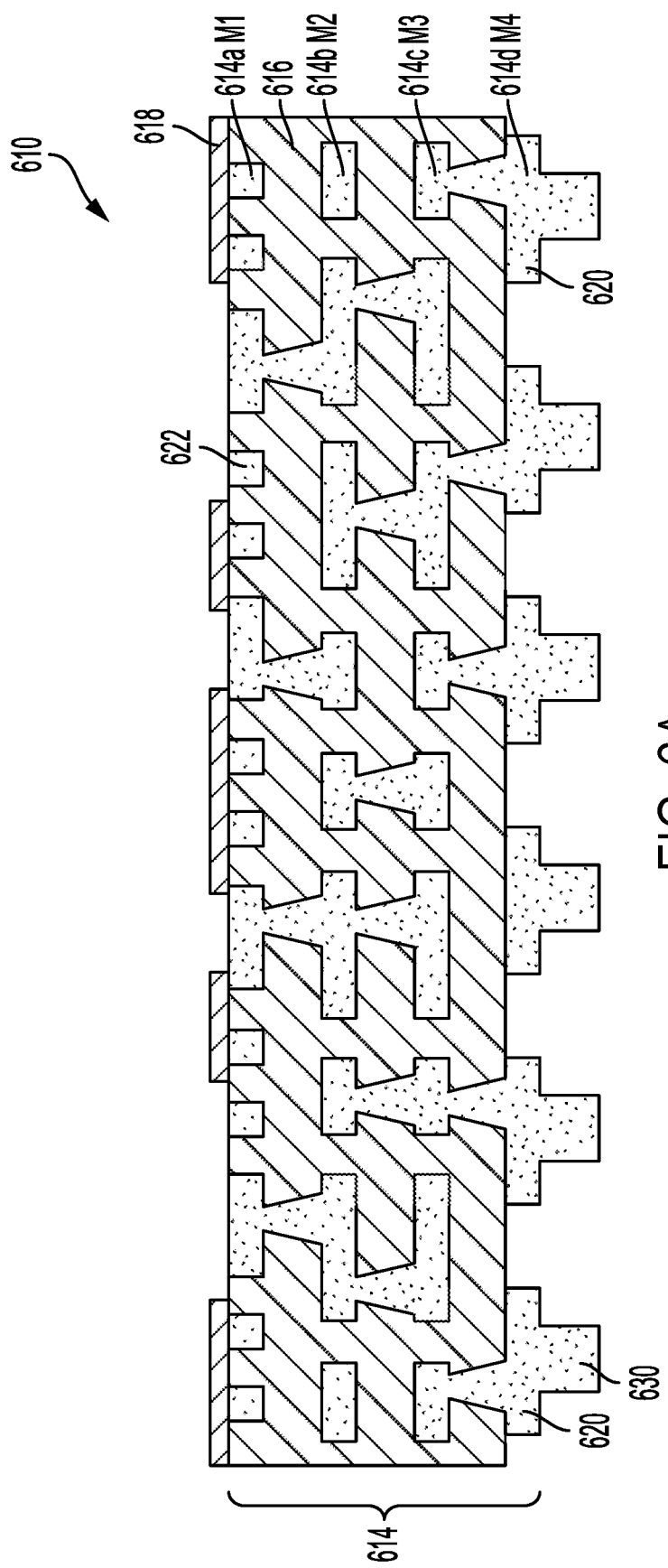

FIG. 6A illustrates the first portion of the substrate 610 (e.g., a top portion). The first portion of the substrate 610 includes a first plurality of metal layers 614. The first plurality of metal layers 614 include a first metal layer 614*a*, a second metal layer 614*b*, a third metal layer 614*c*, and a fourth metal layer 614*d*, separated by a first plurality of insulation layers 616 configured to electrically insulate the first plurality of metal layers 614 from each other.

FIG. 6A illustrates a first plurality of posts 630 coupled to a first plurality of pads 620. The first plurality of pads 620 are formed on the fourth metal layer 614*d*. Photoresist 618 is placed over at least some of the first plurality of traces 622 so as to avoid electrical shorting if other interconnects (not shown, such as die interconnects) are coupled to the first plurality of traces 622.

Figure 6B:
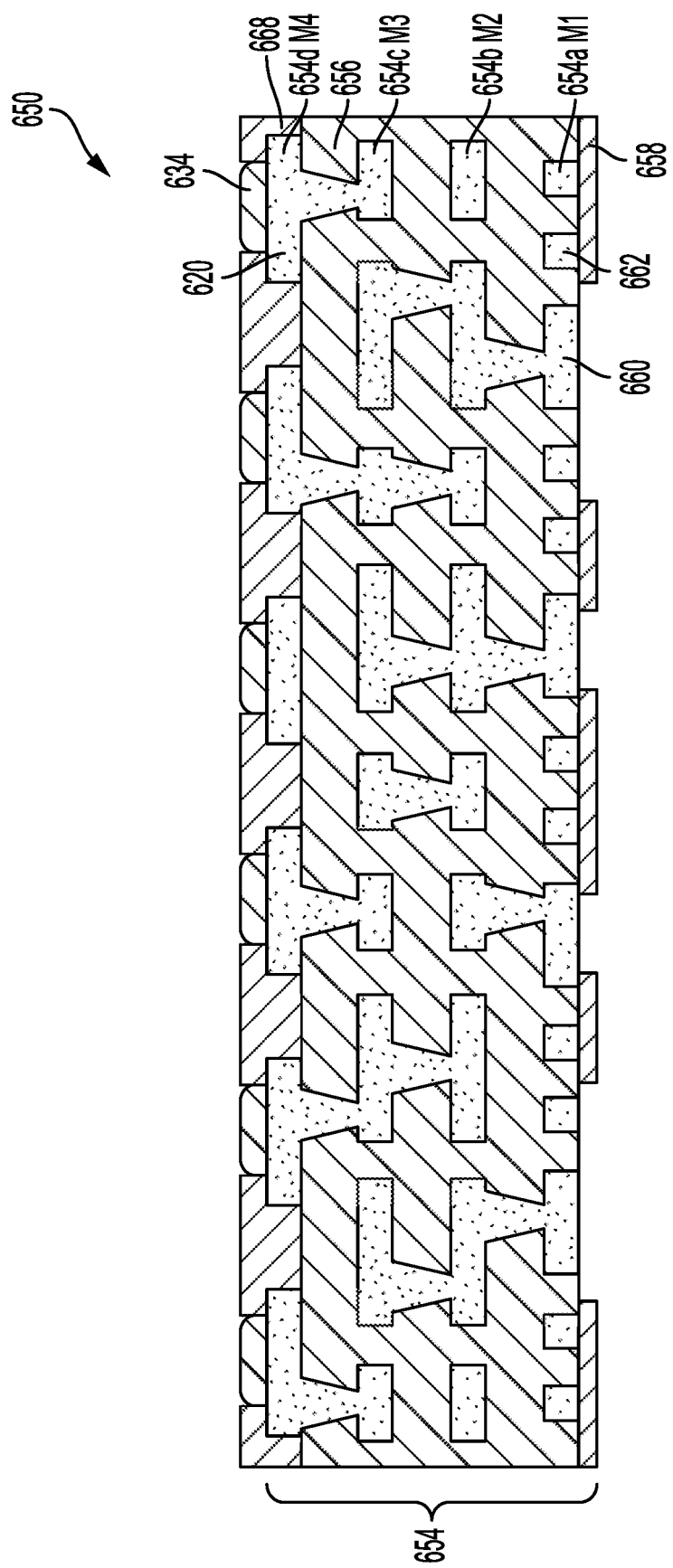

FIG. 6B illustrates the second portion of the substrate 650 (e.g., a bottom portion). The second portion the substrate 650 includes a second plurality of metal layers 654. The second plurality of metal layers 654 include a first metal layer 654*a*, a second metal layer 654*b*, a third metal layer 654*c*, and a fourth metal layer 654*d*, separated by a second plurality of insulation layers 656 configured to electrically insulate the first plurality of metal layers 654 from each other.

The second portion of the substrate 650 includes a photoresist 658 placed over at least some of the second plurality of traces 662 of the first metal layer 654*a* so as to avoid electrical shorting if other interconnects (not shown, such as die interconnects) are coupled to the second plurality of traces 662.

A plurality of interconnects 634 are located on the plurality of pads 620 on the fourth metal layer 654*d*. The plurality of interconnects 634 comprises a plurality of solder interconnects. A photoresist 668 is also placed over and in between the fourth metal layer 654*d*. Specifically, the photoresist 668 is placed over and in between a plurality of pads 620 on the fourth metal layer 654*d*. The photoresist 668 is also placed between each one of the plurality of interconnects 634 to protect against shorting the plurality of interconnects 634.

Figure 6C:
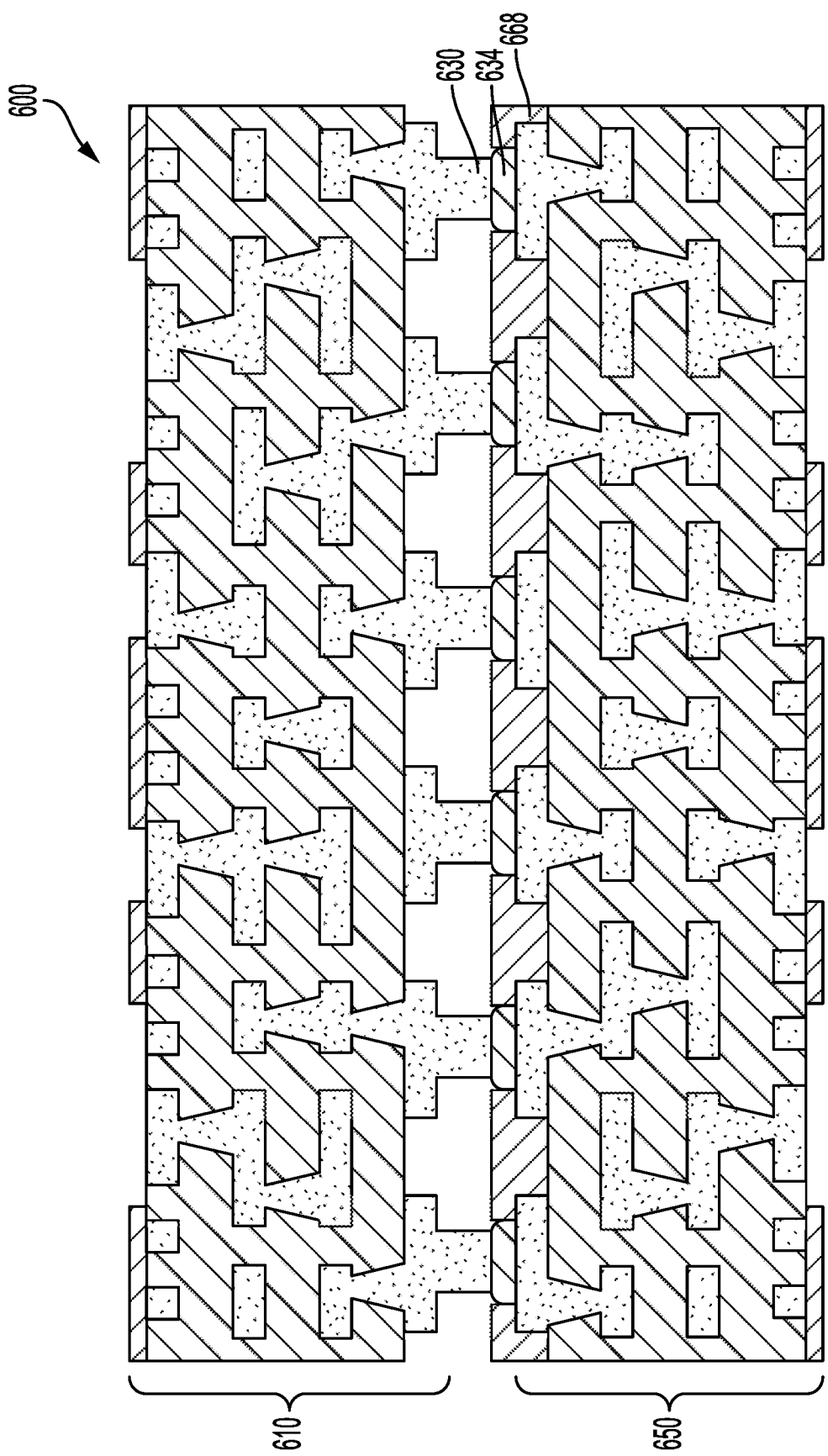

FIG. 6C illustrates a double sided embedded trace substrate 600 (or substrate 600 for brevity) including the first portion 610 of the substrate 600 and the second portion 650 of the substrate 600. The first plurality of posts 630 are coupled to the plurality of interconnects 634 (e.g., the plurality of solder interconnects). That is, the first plurality of posts 630 are coupled to the plurality of solder interconnects 634. The first portion 610 and the second portion 650 are electrically coupled together by way of the first plurality of posts 630 are coupled to the plurality of interconnects 634.

Figure 6D:
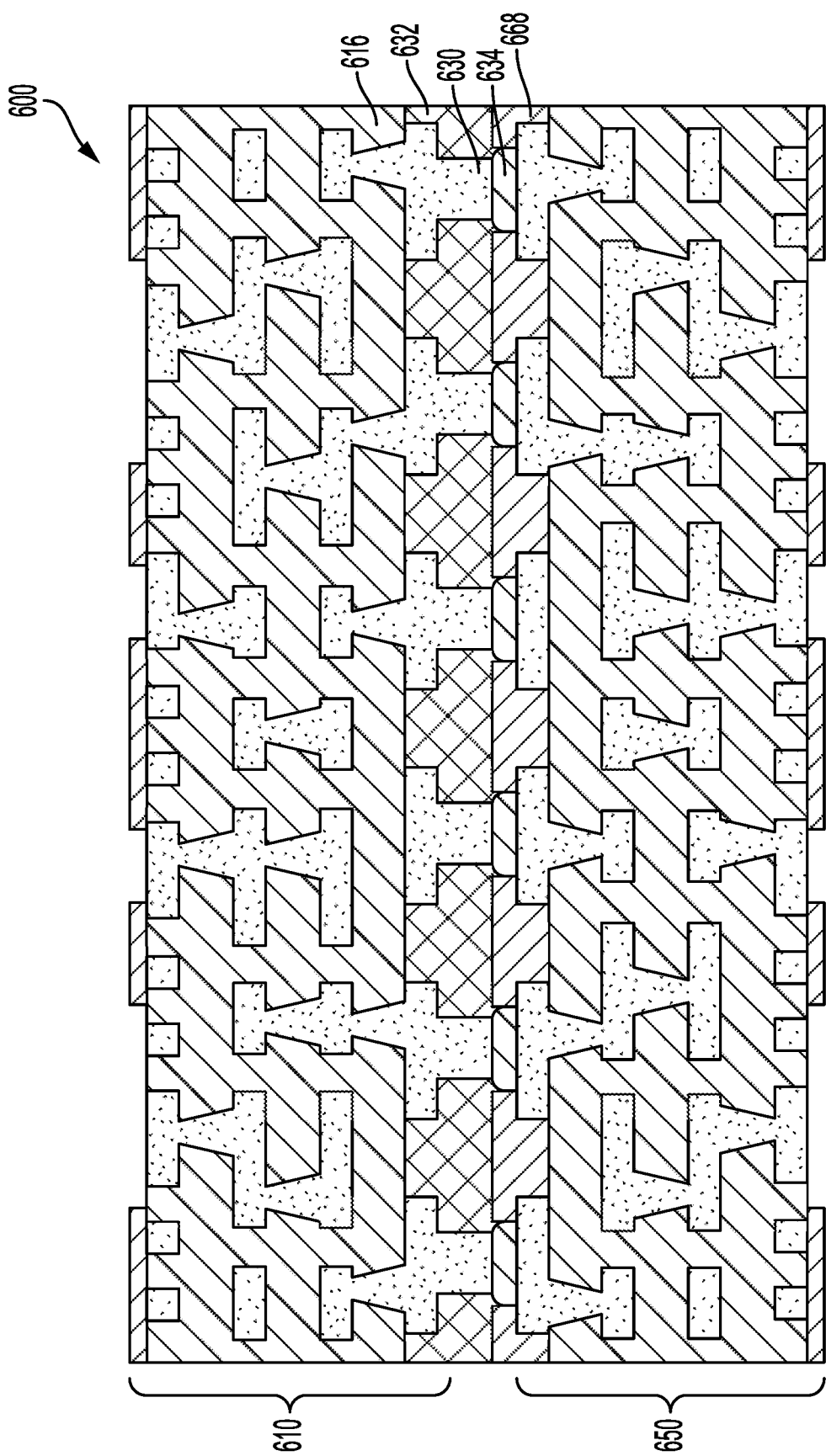

FIG. 6D illustrates the double sided embedded trace substrate 600 after the plurality of interconnects 634 comprising the plurality of solder interconnects has been reflowed (e.g., melted so that the solder interconnects 634 operate to attach the first portion 610 to the second portion 650 of the substrate 600) so that the first portion 610 and the second portion 650 are electrically coupled together and physically attached. A mold 632 is configured to fill in any gaps between any one of the first plurality of insulation layers 616 and the photoresist 668, as well as to fill in any gaps between any of the first plurality of posts 630. The mold 632 may be of the following material, but is not so limited: mold, non-conductive paste, non-conductive film. Furthermore, as an alternative, a dielectric or insulative material may be used instead of the mold 632. FIG. 6D is similar to FIG. 2.

Although not shown, any one or more of the plurality of ICs 404 illustrated in FIG. 4 may be coupled to the double sided embedded trace substrate 600. That is, ICs such as 404*a* and 404*b* may be mounted to the first portion 610 (e.g., top portion) of the double sided embedded trace substrate 600 via the first plurality of pads 620. ICs such as 404*c* and 404*d* may be mounted to the second portion 650 (e.g., bottom portion) of the double sided embedded trace substrate 600 via the second plurality of pads 660.

FIG. 7A-7D illustrate the remaining sequence of manufacturing process steps for manufacturing a double sided embedded trace substrate, such as the double sided embedded trace substrate of FIG. 3 (wherein the plurality of interconnects 334 comprise a second plurality of posts). The remaining sequence of manufacturing process steps illustrated in FIG. 7A-D continues from FIG. 5F.

Figure 7A:
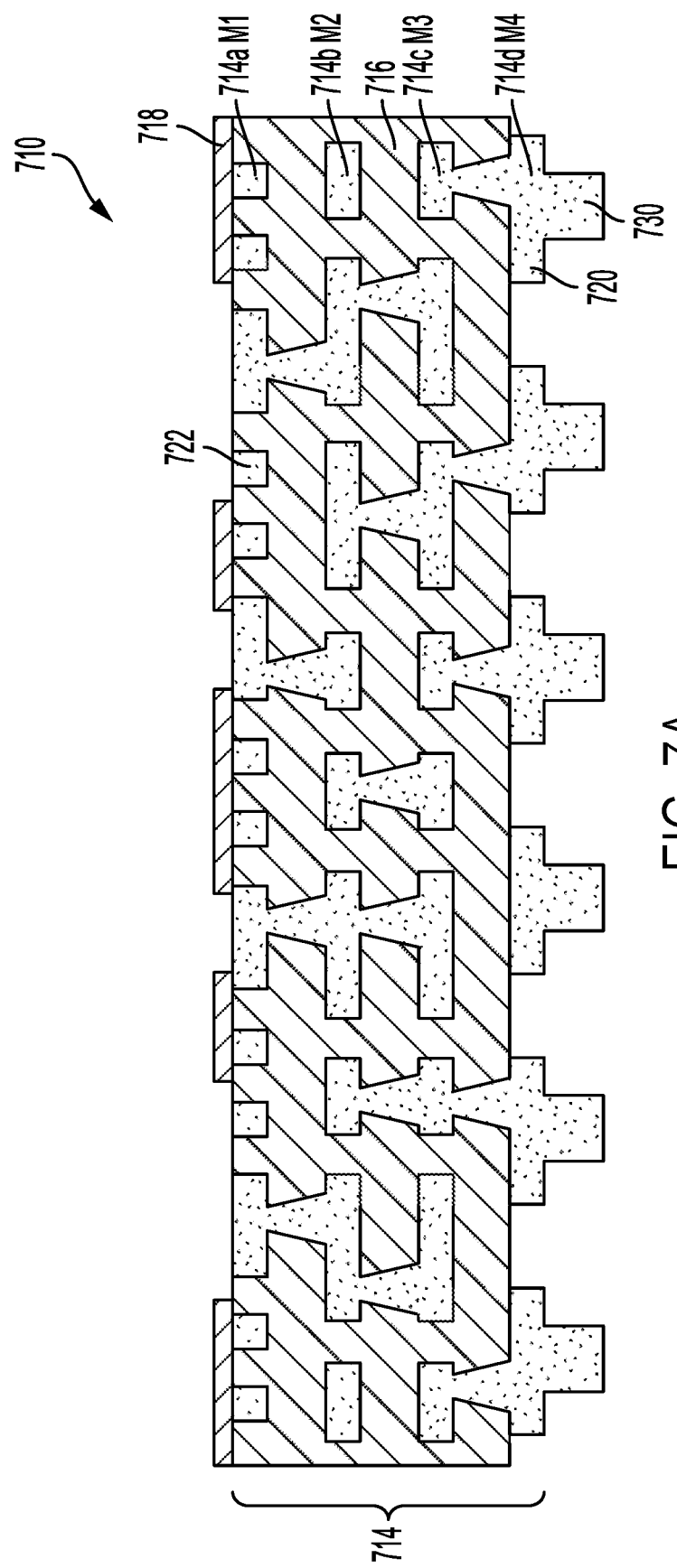

FIG. 7A illustrates the first portion of the substrate 710. The first portion of the substrate 710 includes a first plurality of metal layers 714. The first plurality of metal layers 714 include a first metal layer 714*a*, a second metal layer 714*b*, a third metal layer 714*c*, and a fourth metal layer 714*d*, separated by a first plurality of insulation layers 716 configured to electrically insulate the first plurality of metal layers 714 from each other. A first plurality of posts 730 are coupled to a first plurality of pads 720 on the fourth metal layer 714*d*. The first plurality of pads 720 are formed on the fourth metal layer 714*d*. Photoresist 718 is placed over at least some of a first plurality of traces 722 so as to avoid electrical shorting if other interconnects (not shown, such as die interconnects) are coupled to the first plurality of traces 722.

Figure 7B:
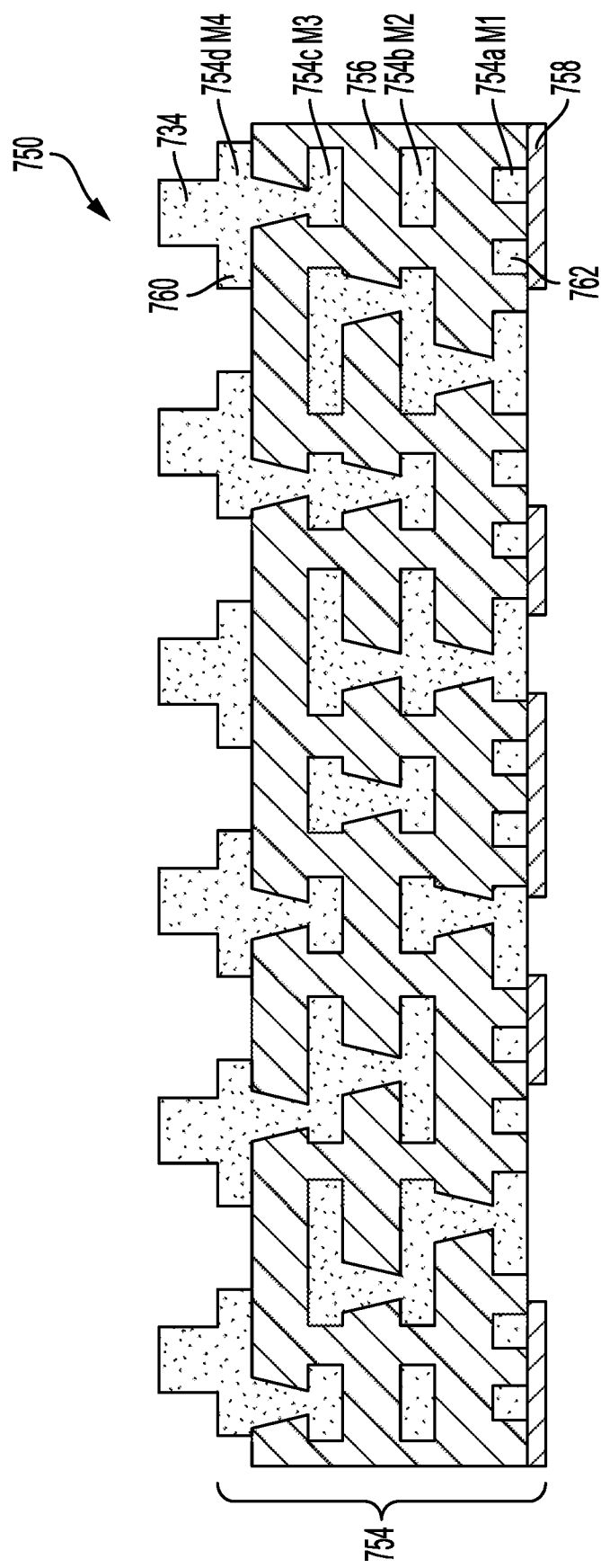

FIG. 7B illustrates the second portion of the substrate 750. The second portion the substrate 750 includes a second plurality of metal layers 754. The second plurality of metal layers 754 include a first metal layer 754*a*, a second metal layer 754*b*, a third metal layer 754*c*, and a fourth metal layer 754*d*, separated by a second plurality of insulation layers 756 configured to electrically insulate the first plurality of metal layers 754 from each other.

The second portion of the substrate 750 includes a photoresist 758 placed over at least some of the second plurality of traces 762 of the first metal layer 754a so as to avoid electrical shorting if other interconnects (not shown, such as die interconnects) are coupled to the second plurality of traces 762. A plurality of interconnects 734 are located on the plurality of pads 750 on the fourth metal layer 754d. The plurality of interconnects 734 comprises a second plurality of posts.

Figure 7C:
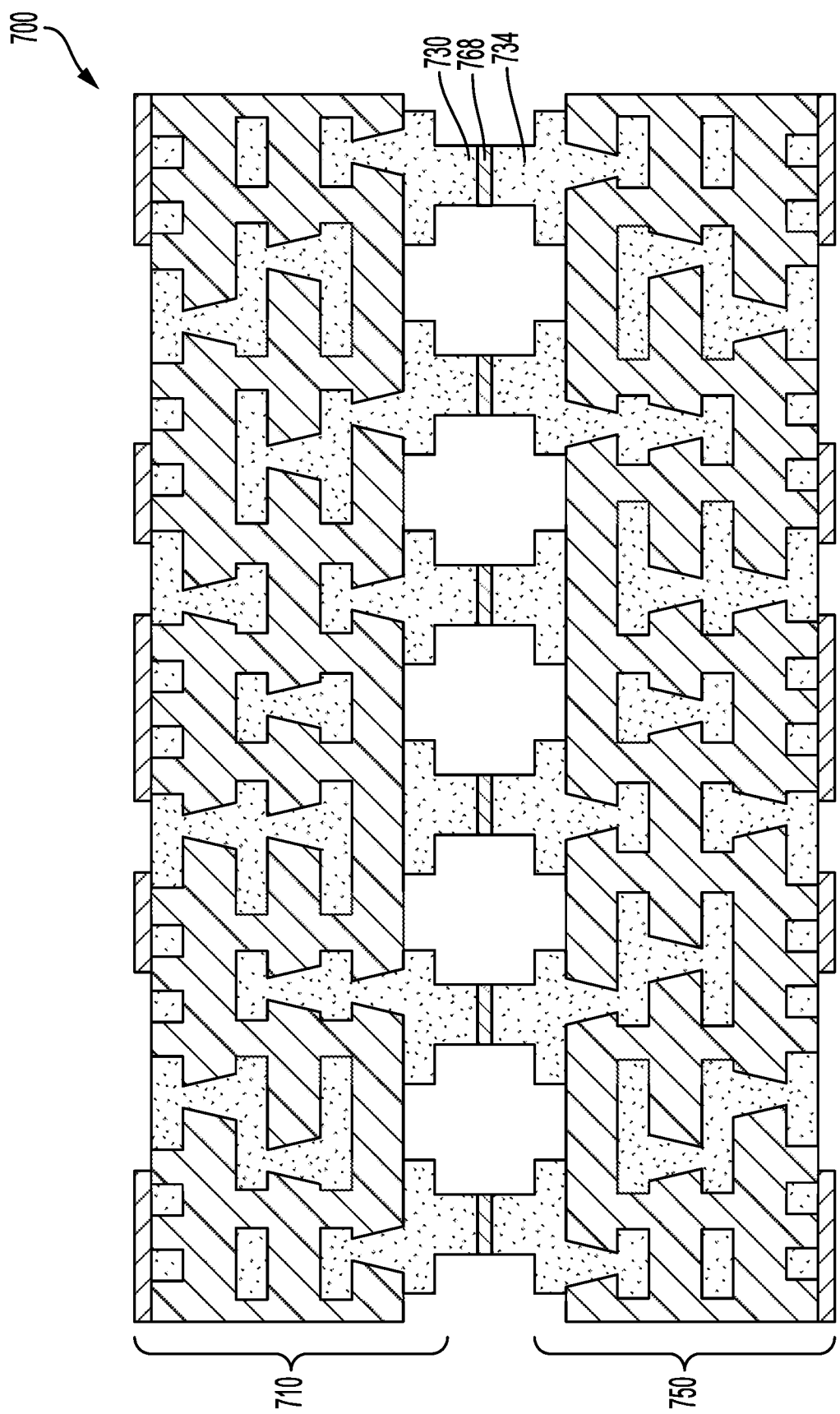

FIG. 7C illustrates a double sided embedded trace substrate 700 (or substrate 700 for brevity) including the first portion 710 of the substrate 700 and the second portion 750 of the substrate 700. The first plurality of posts 730 are coupled to the plurality of interconnects 734 (e.g., the second plurality of posts) through a conductive film 768. The conductive film 768 is electrically conductive and enables the electrical connection between the first plurality of posts 730 and the plurality of interconnects 734.

Figure 7D:
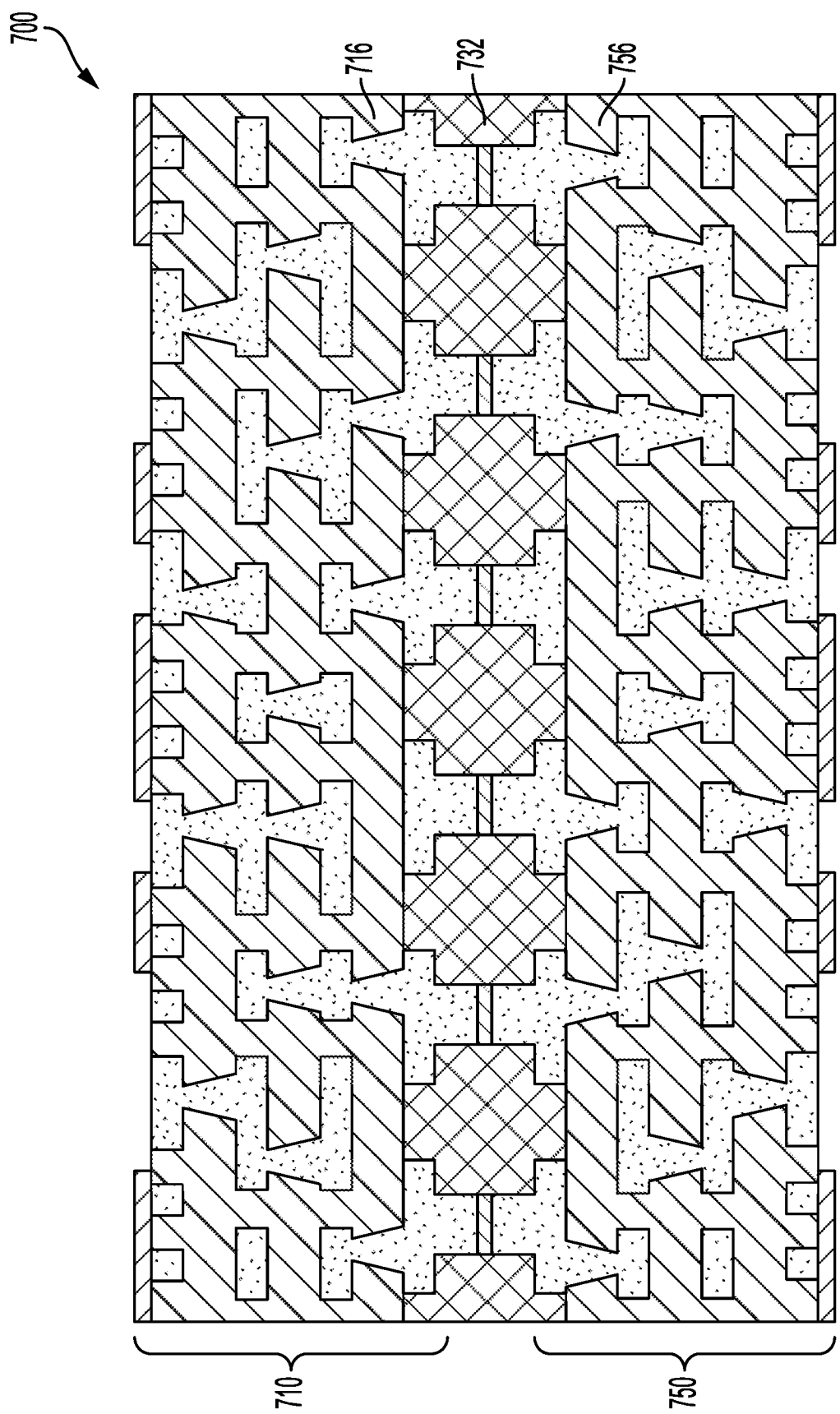

FIG. 7D illustrates the double sided embedded trace substrate 700 after a mold 732 is configured to fill in any gaps between one of the first plurality of insulation layers 716 of the first portion 710 and one of the second plurality of insulation layers 756 of the second portion 750 of the substrate 700, as well as to fill in any gaps between any of the first plurality of posts 730 and between any of the second plurality of posts 734 (e.g. plurality of interconnects). FIG. 7D is similar to FIG. 3.

Although not shown, any one or more of the plurality of ICs 404 illustrated in FIG. 4 may be coupled to the double sided embedded trace substrate 700. That is, ICs such as 404a and 404b may be mounted to the first portion 710 (e.g., top portion) of the double sided embedded trace substrate 700 via the first plurality of pads 720. ICs such as 404c and 404d may be mounted to the second portion 750 (e.g., bottom portion) of the double sided embedded trace substrate 700 via the second plurality of pads 760.

Exemplary Flow Diagram of a Method for Fabricating a Double Sided Embedded Trace Substrate In some implementations, fabricating a double sided embedded trace substrate includes several processes. FIG. 8 illustrates an exemplary flow diagram of a method 800 for providing or fabricating a double sided embedded trace substrate. In some implementations, the method 800 of FIG. 8 may be used to fabricate the double sided embedded trace substrate of FIGS. 2, 3, 4, 5, 6, and 7 as described in the disclosure.

It should be noted that the sequence of FIG. 8 may combine one or more processes in order to simplify and/or clarify the method for providing or fabricating a die. In some implementations, the order of the processes may be changed or modified.

The method at 802 includes forming a first portion of the substrate including forming a first plurality of metal layers.

The method at 804 includes forming a second portion of the substrate including forming a second plurality of metal layers.

The method at 806 includes forming a plurality of insulating layers configured to separate the first plurality of metal layers and the second plurality of metal layers.

The method at 808 includes forming a first plurality of posts and a plurality of interconnects, and coupling the first plurality of posts to the plurality of interconnects such that the first portion of the substrate and the second portion of the substrate are coupled together Exemplary Electronic Devices FIG. 9 illustrates various electronic devices that may be integrated with any of the aforementioned double sided embedded trace substrate. For example, a mobile phone device 902, a laptop computer device 904, a fixed location terminal device 906, a wearable device 908 may include an integrated device 900 as described herein. The integrated device 900 may be, for example, any of the substrate, integrated circuits, dies, integrated devices, integrated device packages, integrated circuit devices, device packages, integrated circuit (IC) packages, package-on-package devices described herein. The devices 902, 904, 906, 908 illustrated in FIG. 9 are merely exemplary. Other electronic devices may also feature the integrated device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2 through 7 (where FIG. 7 includes 7A-7d) may be rearranged and/or combined into a single component, process, feature or function or embodied in several components, processes, or functions. Additional elements, components, processes, and/or functions may also be added without departing from the disclosure. It should also be noted that FIGS. 2 through 7 (where FIG. 7 includes 7A-7d) and its corresponding description in the present disclosure is not limited to double sided embedded trace substrate. In some implementations, FIGS. 2 through 7 (where FIG. 7 includes 7A-7d) and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "traverse" as used herein, means to go across and includes going all the way across an object or partially across an object.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A substrate comprising:
a first portion of the substrate including a first plurality of metal layers,
wherein the first plurality of metal layers includes a first plurality of interconnects located on a first surface of the first portion of the substrate, and
wherein the first plurality of interconnects are part of a metal layer located on the first surface of the first portion of the substrate;
a second portion of the substrate including a second plurality of metal layers,
wherein the second plurality of metal layers includes a second plurality of interconnects located on a second surface of the second portion of the substrate, and
wherein the second plurality of interconnects are part of another metal layer located on the second surface of the second portion of the substrate;
a plurality of insulating layers configured to separate the first plurality of metal layers and the second plurality of metal layers;
a first plurality of posts and a plurality of solder interconnects coupled together such that (i) the first plurality of posts and the plurality of solder interconnects couple the first portion of the substrate to the second portion of the substrate, and (ii) the first surface of the first portion of the substrate faces the second surface of the second portion of the substrate; and
a mold located between the first portion of the substrate and the second portion of the substrate, wherein the mold is coupled to the first surface of the first portion of the substrate and the second surface of the second portion of the substrate.

2. The substrate of claim 1, further comprising:
a first metal layer of the first plurality of metal layers includes a first plurality of traces embedded in the first portion of the substrate; and
a second metal layer of the second plurality of metal layers includes a second plurality of traces embedded in the second portion of the substrate.

3. The substrate of claim 2:
wherein the first metal layer is a top layer of the substrate, and the first plurality of traces are configured to couple to a surface mount circuit component; and
wherein the second metal layer is a bottom layer of the substrate and the second plurality of traces are configured to couple to another surface mount circuit component.

4. The substrate of claim 2:
wherein the first plurality of posts are located on an inner metal layer of the substrate; and
wherein the substrate further comprises a second plurality of posts that are located on another inner metal layer of the substrate.

5. The substrate of claim 1,
wherein the first plurality interconnects and the second plurality of interconnects are encapsulated by the mold, and
wherein the mold includes a non-conductive paste and/or a non-conductive film.

6. The substrate of claim 1,
wherein the plurality of solder interconnects are located inside of the substrate, and
wherein the plurality of solder interconnects are located between the first portion of the substrate and the second portion of the substrate.

7. The substrate of claim 6, wherein the plurality of solder interconnects are at least partially surrounded by solder resist, wherein the solder resist is located inside of the substrate.

8. The substrate of claim 1,
wherein the first plurality of metal layers from the first portion of the substrate includes three or more metal layers, and
wherein the second plurality of metal layers from the second portion of the substrate includes three or more metal layers.

9. The substrate of claim 1, further comprising a second plurality of posts, wherein the first plurality of posts are coupled to the second plurality of posts through the plurality of solder interconnects.

10. The substrate of claim 1, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. A method of fabricating a substrate, comprising:
forming a first portion of the substrate including forming a first plurality of metal layers comprising a metal layer that is located on a first surface of the first portion of the substrate;
forming a second portion of the substrate including forming a second plurality of metal layers comprising another metal layer that is located on a second surface of the second portion of the substrate;
forming a plurality of insulating layers configured to separate the first plurality of metal layers and the second plurality of metal layers;
forming a first plurality of posts and a plurality of solder interconnects;
coupling the first plurality of posts to the plurality of solder interconnects such that (i) the first portion of the substrate and the second portion of the substrate are coupled together, and (ii) the first surface of the first portion of the substrate faces the second surface of the second portion of the substrate, wherein coupling the first plurality of posts to the plurality of solder interconnects forms a gap between the first portion of the substrate and the second portion of the substrate; and
filling the gap with a mold, such that the mold is coupled to the first surface of the first portion of the substrate and the second surface of the second portion of the substrate.

12. The method of claim 11, further comprising:
forming a first plurality of traces embedded in the first portion of the substrate, the first plurality of traces formed in a first metal layer of the first plurality of metal layers; and
forming a second plurality of traces embedded in the second portion of the substrate, the second plurality of traces formed in a second metal layer of the second plurality of metal layers.

13. The method of claim 12:
wherein the first metal layer is a top layer of the substrate, and the first plurality of traces are configured to couple to a surface mount circuit component; and
wherein the second metal layer is a bottom layer of the substrate and the second plurality of traces are configured to couple to another surface mount circuit component.

14. The method of claim 11, wherein the mold includes a non-conductive paste and/or a non-conductive film.

15. The method of claim 11, wherein the plurality of solder interconnects are located inside of the substrate.

16. The method of claim 15, wherein the plurality of solder interconnects are at least partially surrounded by solder resist, wherein the solder resist is located inside the substrate.

17. The method of claim 16, wherein coupling the first plurality of posts to the plurality of solder interconnects comprises coupling the first plurality of posts to a second plurality of posts through the plurality of solder interconnects, wherein the first plurality of posts are located over the second plurality of posts.

18. The method of claim 11, wherein the first portion of the substrate and the second portion of the substrate are fabricated using an embedded trace substrate process.

19. A substrate comprising:
a first portion of the substrate including a first plurality of metal layers, wherein the first plurality of metal layers includes a first plurality of traces located on a first surface of the first portion of the substrate;
a second portion of the substrate including a second plurality of metal layers, wherein the second plurality of metal layers includes a second plurality of traces located on a second surface of the second portion of the substrate;
a plurality of insulating layers configured to separate the first plurality of metal layers and the second plurality of metal layers;
a first plurality of posts and a second plurality of posts coupled together through a conductive film such that (i) the first plurality of posts and the second plurality of posts couple the first portion of the substrate to the second portion of the substrate, and (ii) the first surface of the first portion of the substrate faces the second surface of the second portion of the substrate; and
a mold located between the first portion of the substrate and the second portion of the substrate, wherein the mold is coupled to the first surface of the first portion of the substrate and the second surface of the second portion of the substrate.

20. The substrate of claim 19,
wherein the first plurality traces and the second plurality of traces are encapsulated by the mold,
wherein the conductive film includes an anisotropic conductive film and/or an adhesive, and
wherein the mold includes a non-conductive paste and/or a non-conductive film.

21. The substrate of claim 19,
wherein the first plurality of metal layers from the first portion of the substrate includes three or more metal layers, and
wherein the second plurality of metal layers from the second portion of the substrate includes three or more metal layers.

* * * * *